(12) United States Patent
Hiraiwa et al.

(10) Patent No.: US 8,178,364 B2
(45) Date of Patent: May 15, 2012

(54) TESTING METHOD OF SURFACE-EMITTING LASER DEVICE AND TESTING DEVICE THEREOF

(75) Inventors: Koji Hiraiwa, Tokyo (JP); Takeo Kageyama, Tokyo (JP); Norihiro Iwai, Tokyo (JP); Keishi Takaki, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 163 days.

(21) Appl. No.: 12/796,225

(22) Filed: Jun. 8, 2010

(65) Prior Publication Data

US 2011/0003403 A1    Jan. 6, 2011

Related U.S. Application Data

(60) Continuation-in-part of application No. 12/749,188, filed on Mar. 29, 2010, now abandoned, which is a continuation of application No. 12/166,422, filed on Jul. 2, 2008, now abandoned, which is a division of application No. 11/554,973, filed on Oct. 31, 2006, now Pat. No. 7,418,020.

(30) Foreign Application Priority Data

Oct. 31, 2005  (JP) .................................. 2005-316946
Oct. 25, 2006  (JP) .................................. 2006-290223

(51) Int. Cl.
*H01L 21/66* (2006.01)
*H01L 23/58* (2006.01)
*G01R 31/26* (2006.01)
*G01R 31/10* (2006.01)

(52) U.S. Cl. ................ 438/14; 438/15; 438/16; 438/17; 257/48; 324/750.05

(58) Field of Classification Search .................. None
See application file for complete search history.

(56) References Cited

U.S. PATENT DOCUMENTS

| 4,670,355 A | 6/1987 | Matsudaira |
| 4,962,985 A | 10/1990 | LeGrange |
| 2006/0013276 A1 | 1/2006 | McHugo |
| 2007/0091965 A1 | 4/2007 | Tanabe et al. |

FOREIGN PATENT DOCUMENTS

| JP | 1-239890 | 9/1989 |
| JP | 2-196202 | 8/1990 |
| JP | 2000-68604 | 3/2000 |
| JP | 2002-335045 | 11/2002 |
| JP | 2003-69150 | 3/2003 |
| JP | 2004-273752 | 9/2004 |
| JP | 2005-191260 | 7/2005 |
| JP | 2005-209928 | 8/2005 |

OTHER PUBLICATIONS

Office Action issued May 20, 2011, in Japanese Patent Application No. 2006-290223 with English translation.

*Primary Examiner* — Scott B Geyer
(74) *Attorney, Agent, or Firm* — Oblon, Spivak, McClelland, Maier & Neustadt, L.L.P.

(57) ABSTRACT

A method of performing a wafer level burn-in test for a plurality of surface-emitting laser devices formed on a wafer includes causing a plurality of contact electrodes arranged in a same plane with a pitch same as that of the surface-emitting laser devices being electrically connected to each other to have contact with pad electrodes of the surface-emitting laser devices, respectively, and applying a current to second electrodes of the surface-emitting laser devices and the contact electrodes. The wafer level burn-in test is performed while heating the wafer at a predetermined temperature. Laser lights emitted from the surface-emitting laser devices are monitored during the wafer level burn-in test.

14 Claims, 17 Drawing Sheets

Fig. 7
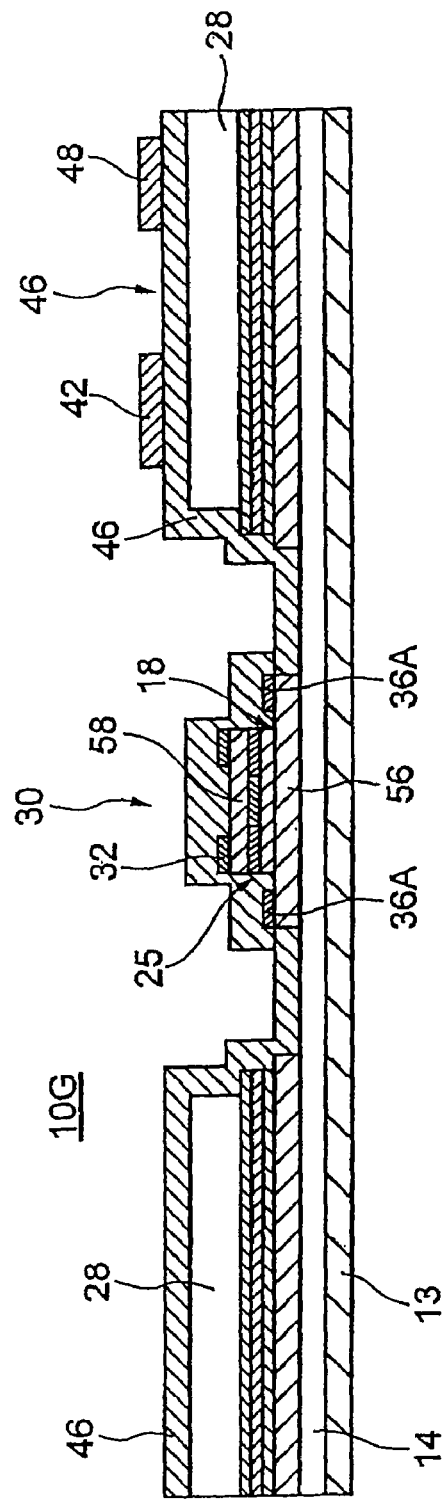
(a)
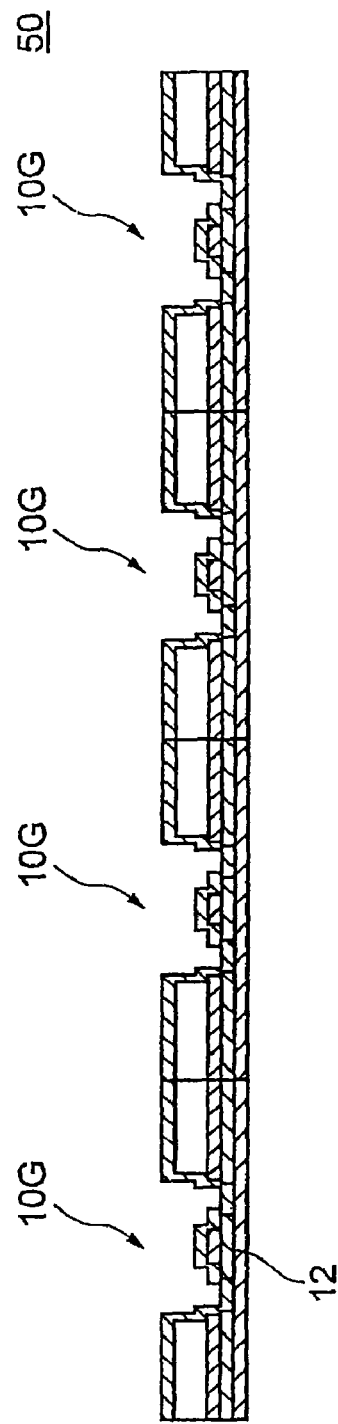
(b)

Fig. 11
(a) 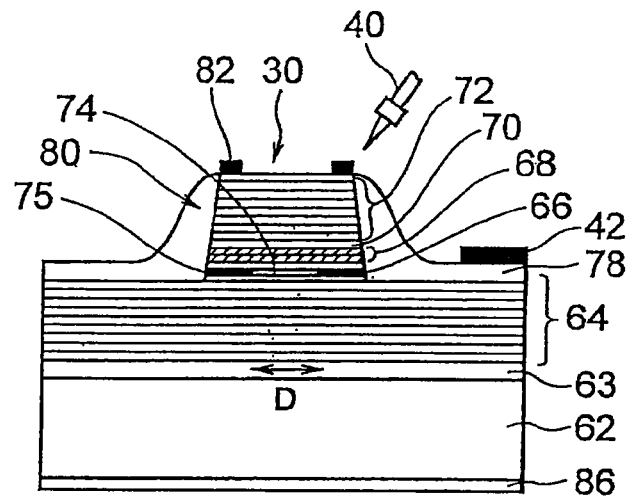
(b) 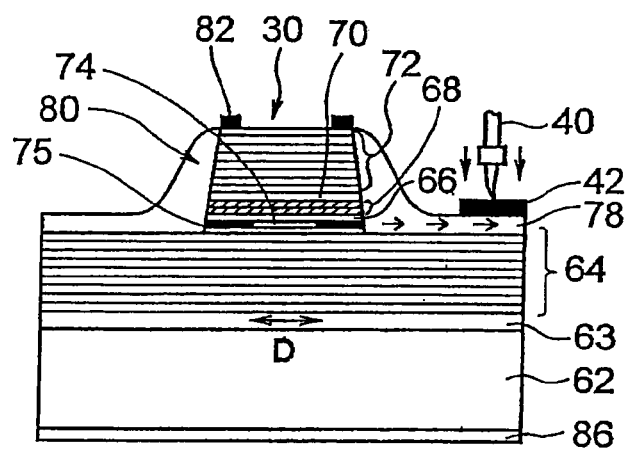
(c) 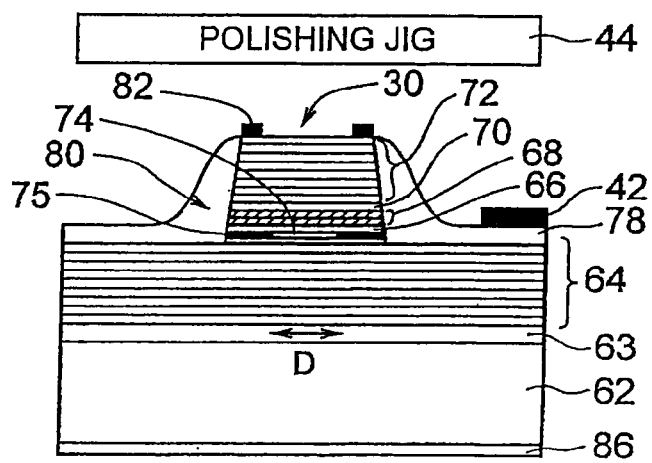

US 8,178,364 B2

TESTING METHOD OF SURFACE-EMITTING LASER DEVICE AND TESTING DEVICE THEREOF

CROSS REFERENCE TO RELATED APPLICATION

This application a Continuation-in Part application of U.S. patent application Ser. No. 12/749,188, filed Mar. 29, 2010. U.S. patent application Ser. No. 12/749,188 is a continuation and claims the benefit of priority under 35 U.S.C. §120 from 12/166,422, filed Jul. 2, 2008. U.S. application Ser. No. 12/166,422 is a divisional of U.S. application Ser. No. 11/554,973, filed Oct. 31, 2006, the entire contents of three applications are incorporated herein by reference. This application and U.S. application Ser. Nos. 12/166,422, 11/554,973 and 12/749,188 all claim the benefit of priority under 35 U.S.C. §119 of Japanese Patent Application No. 2005-316946, filed on Oct. 31, 2005 and Japanese Patent Application No. 2006-290223, filed on Oct. 25, 2006.

FIELD OF THE INVENTION

The present invention relates to a testing method of performing a wafer level burn-in test for a plurality of surface-emitting laser devices formed on a wafer and a testing device thereof.

BACKGROUND ART

Vertical-cavity surface-emitting laser (VCSEL which is referred to as simply surface-emitting laser device or VCSEL device hereinafter) is a semiconductor laser device which emits laser light in the direction perpendicular to the substrate surface thereof. The surface-emitting laser device is such that a large number of VCSEL devices can be arranged in a two-dimensional array on a common substrate, and now attracts an attention as a light source in the field of communication as well as a specific device for a variety of applications.

The VCSEL device has a resonator structure, wherein a pair of semiconductor distributed-Brag-reflector mirrors (DBR mirrors) are formed on a semiconductor substrate such as GaAs or InP, and an active layer configuring an emission region is provided between the pair of DBR mirrors. For example, a GaAs-group VCSEL device can be formed on a GaAs substrate, and AlGaAs-based DBR mirrors (such as including AlAs/AlGaAs layer pairs) having an excellent heat conductivity and a higher reflectance can be used. Thus, the GaAs-group VCSEL device is expected as a promising laser device emitting a light having a wavelength range between 0.8 μm and 1.0 μm. In addition, a VCSEL device including an active layer configured by GaInNAs-based materials is expected as a promising laser device which emits laser of a longer wavelength range between 1.2 μm and 1.6 μm.

As a VCSEL device, an oxide-confinement-type surface-emitting semiconductor laser device is proposed which has a structure wherein an Al-oxidized layer confines the current injection area for improving the current efficiency and reducing the threshold current thereof.

With reference to FIG. 10, the configuration of a conventional surface-emitting semiconductor laser device used in a 850-nm-wavelength range and having an oxide-layer-confinement structure will be described hereinafter. FIG. 10 is a perspective sectional view depicting the configuration of the conventional 850-nm-range surface-emitting semiconductor laser device having the oxide-layer-confinement structure. The surface-emitting semiconductor laser device 100 has, on a p-type GaAs (p-GaAs) substrate 62, a layer structure including a buffer layer 63, a bottom DBR mirror 64 including 35 pairs of p-$Al_{0.9}$GaAs/p-$Al_{0.2}$GaAs layers each having a layer thickness corresponding to λ/4n (λ and n are emission wavelength and refractive index, respectively), a lower cladding layer 66, a quantum-well active layer 68, an upper cladding layer 70, and a top DBR mirror 72 having 25 pairs of n-$Al_{0.9}$GaAs/n-$Al_{0.2}$GaAs layers each having a layer thickness corresponding to λ/4n.

In the bottom DBR mirror 64, one of the $Al_{0.9}$GaAs layers disposed in the vicinity of the quantum-well active layer 68 is replaced by an AlAs layer 74, and the Al in an area of the AlAs layer 74 other than the central current-injection area thereof is selectively oxidized to configure an Al-oxidized layer 75 as the current-confinement layer. A part of the layer structure disposed between the top portion thereof and a portion of the bottom DBR mirror is configured as a mesa-post 80, on which a ring electrode 82 is formed. The conventional VCSEL device 100 having the above structure is manufactured by a process as described below.

First, semiconductor layers configuring the layer structure are deposited using an epitaxial-growth technique. Subsequently, a portion of the layer structure disposed between the top DBR mirror 72 and a portion of the bottom DBR mirror 64 is subjected to an etching treatment using a photolithographic and etching process, to configure a cylindrical mesa-post 80 having a diameter of 30 μm, for example. In the step of forming the mesa-post 80, a configuration may be employed wherein a semiconductor layer portion other than the mesa-post 80 is removed by etching in its entirety, or an annular groove is formed by the etching to configure the mesa-post inside the annular groove and a peripheral area surrounding the annular groove. The example shown in the figure is such that the portion of the semiconductor layers other than the mesa-post 80 is removed by etching in its entirety.

An oxidation process is conducted wherein the layer structure configured as the mesa-post 80 is maintained in a steam atmosphere at a temperature of about 400 degrees C., to thereby selectively oxidize the Al in the AlAs layer 74 from outside of the mesa-post 80, whereby a current confinement layer including the Al-oxidized layer 75 is formed within the AlAs layer 74.

Subsequently, a SiNx passivation layer 76 is formed over the entire area of the wafer including the top surface and side surface of the mesa-post 80 and a portion of the p-type bottom DBR mirror 64 near the mesa-post 80. Thereafter, a polyimide film 78 is formed on the entire area of the wafer by coating, followed by curing the polyimide film 78 in a three-step heat treatment wherein temperatures of 200 degrees C., 300 degrees C. and 400 degrees C. are maintained for 40 minutes, 60 minutes and 60 minutes, respectively. Subsequently, a photolithographic process is conducted to remove a portion of the polyimide film 78 on the top surface of the mesa-post 80, thereby exposing the SiNx passivation layer 76. The polyimide film 78, which is formed by coating to have a substantially uniform thickness, is subjected to the influence by the contraction etc. of the polyimide due to the post-coating heat treatment, thereby assuming a shape wherein the polyimide film is highest at the mesa-post area and gradually reduces the height in the peripheral portion.

Subsequently, an RIE system is used to etch a portion of the SiNx passivation layer 76 exposed on the mesa-post 80 by using CF4 gas as an etching gas, thereby forming a window for forming therethrough an n-side electrode. Thereafter, a metallic film is formed by evaporation to form a ring-shaped n-side electrode 82. After forming the n-side electrode 82, the bottom surface of the p-GaAs substrate 62 is polished to adjust the substrate thickness to 200 µm, followed by forming a metallic film on the bottom surface of the substrate by evaporation to form a p-side electrode 86. Subsequently, an electrode anneal is conducted at an anneal temperature of 400 degrees C. for 3 minutes. After those steps as recited above, the wafer process is finished. Subsequently, the wafer is subjected to dicing using a dicing machine to formulate devices, whereby surface-emitting semiconductor laser devices 10A such as shown in FIG. 10 can be obtained. Those devices manufactured in the manner as described above are subjected to measurement tests such as for electric characteristics thereof, and mounted on an optical module etc. after the assembly steps. Conventional VCSEL devices are described in JP-2003-69150A1 and JP-2000-68604A1, for example.

As described above, the VCSEL device is embedded within the polyimide film in its entirety, and then subjected to the polishing process for the bottom surface of the substrate, testing process and assembly process, after the portion of the polyimide film on the top surface of the mesa-post is removed. In those processes, handling of the VCSEL device causes a contact with respect to a variety of testing equipments and jigs, or applies a mechanical pressure etc. thereon.

In the testing process, as shown in FIG. 11(*a*), a measurement probe 40 is shifted on the surface of the wafer on which the mesa-post 80 is formed, in order to contact the measurement probe 40 with the ring electrode 82 of the VCSEL device. Thus, the measurement probe 40 is likely to contact the mesa-post 80. In addition, as shown in FIG. 11(*b*), if the measurement probe 40 contacts the pad electrodes 42 which is formed on the polyimide film 78 in the peripheral area outside the mesa-post 80 and electrically connected to the ring electrode 82, a stress caused by the measurement probe 40 is applied to the mesa-post 80 through the polyimide film 78.

During the polishing process for the bottom surface of the substrate, as shown in FIG. 11 (*c*), a portion of the top surface of the mesa-post 80 of the VCSEL device is attached onto a polishing jig 44, and the polishing is performed in this state. In this case, the attachment of the polishing jig 44 onto the portion configured by the bay window of the mesa-post 80 for emitting therethrough the laser beam is likely to cause a defect on the mesa-post 80. In the assembly process to the optical module, the VCSEL device is likely to contact an optical fiber on the top surface of the mesa-post upon coupling thereof to the optical fiber. Further, before and after the testing process or assembly process, the VCSEL device is likely to be damaged also by a jig such as a pincette upon holding the same by the jig.

As described above, there is a problem in the process for handling the VCSEL device that the mesa-post 80 of the VCSEL device is likely to be damaged on the surface of the mesa-post 80 by a contact with respect to a variety of testing equipments or jigs due to a protruding structure thereof protruding from the peripheral area, or that the VCSEL device is damaged on the mesa-post 80 having therein the resonator structure due to a stress applied thereto.

A method of performing a wafer level burn-in test for surface-emitting laser devices is disclosed in Japanese Patent Application Publication No. 2005-209928. In this prior art, an example which performs Burn-in for surface-emitting laser devices in the situation mounted on can package and an example which performs Burn-in for surface-emitting laser devices in a chip formed in a bar.

Meanwhile, in a fabricating process for the above surface-emitting laser devices, it is required to perform a wafer level burn-in test for a plurality of surface-emitting laser devices formed on a wafer, from the viewpoints of shortening the fabricating process and improving the product yield. Here, a wafer level burn-in test is a technology which screens at a time effectively reliability failures of surface-emitting laser devices formed on wafer.

SUMMARY OF THE INVENTION

It is an object of the present invention to at least provide a simple and practical method and device for testing a plurality of surface-emitting laser devices, in which it is possible to screen effectively reliability failures of all surface-emitting laser devices at wafer level in a collective manner, without inflicting a damage on a mesa-post including an active layer.

According to a first aspect of the present invention, there is provided a method of performing a wafer level burn-in test for a plurality of surface-emitting laser devices formed on a wafer. Each of the surface-emitting laser devices includes a layer structure formed on a substrate, the layer structure including an active layer, where a layer portion including at least the active layer from among the layer structure is formed in a mesa-post, and a top surface of a peripheral area disposed around the mesa-post is higher than a top surface of the mesa-post, a first electrode formed on the top surface of the mesa-post, a pad electrode provided on the top surface of the peripheral area, where the first electrode and the pad electrode are electrically connected to each other, and a second electrode formed on a bottom surface of the substrate. The method includes causing a plurality of contact electrodes arranged in a same plane with a pitch same as that of the surface-emitting laser devices to have contact with pad electrodes of the surface-emitting laser devices, respectively, the contact electrodes being electrically connected to each other and applying a current to second electrodes of the surface-emitting laser devices and the contact electrodes.

Here, "a higher location" means a location which is apart from the substrate on which the VCSEL device is formed by a larger distance.

According to a second aspect of the present invention, the method further includes perfoming the wafer level burn-in test, while heating the wafer to a predetermined temperature.

According to a third aspect of the present invention, the method further includes monitoring laser lights emitted respectively from the surface-emitting laser devices during the wafer level burn-in test.

According to a fourth aspect of the present invention, there is provided a device for performing a wafer level burn-in test for a plurality of surface-emitting laser devices formed on a wafer. Each of the surface-emitting laser devices includes a layer structure formed on a substrate, the layer structure including an active layer, where a layer portion including at least the active layer from among the layer structure is formed in a mesa-post, and a top surface of a peripheral area disposed around the mesa-post is higher than a top surface of the mesa-post, a first electrode formed on the top surface of the mesa-post, a pad electrode provided on the top surface of the peripheral area, where the first electrode and the pad electrode are electrically connected to each other, and a second electrode formed on a bottom surface of the substrate. The device includes a first substrate including a plurality of contact electrodes arranged in a same plane with a pitch same as that of the surface-emitting laser devices, which are electrically connected to each other, a wiring plate including a wiring electrode having contact with the second electrodes of the surface-emitting laser devices, and a power supply unit that applies a current to the contact electrodes and the wiring electrode in a condition that the contact electrodes have contact with pad electrodes of the surface-emitting laser devices and the wiring electrode of the wiring plate has contact with the second electrodes.

According to a fifth aspect of the present invention, the device further includes a stage having a temperature control function of heating the wafer to a predetermined temperature.

According to a sixth aspect of the present invention, the device further includes a plurality of light-receiving elements for respectively monitoring laser lights emitted from the surface-emitting laser devices.

According to a seventh aspect of the present invention, the device further includes a second substrate disposed at a back surface side of the first substrate opposite to a surface on which the contact electrodes are formed. The first substrate is a transparent substrate. The light-receiving elements are disposed on the second substrate at places corresponding to light emitting portions of the surface-emitting laser devices. The laser lights emitted from the surface-emitting laser devices and transmitted through the first substrate are detected by the light-receiving elements, respectively.

According to an eighth aspect of the present invention, the device further includes a second substrate disposed at a back surface side of the first substrate opposite to a surface on which the contact electrodes are formed. The first substrate is an opaque substrate. The first substrate includes a plurality of through holes at places corresponding to light emitting portions of the surface-emitting laser devices. The laser lights emitted from the surface-emitting laser devices are transmitted through the through holes and detected by the light-receiving elements, respectively.

According to a ninth aspect of the present invention, there is provided a method of performing a wafer level burn-in test for a plurality of surface-emitting laser devices formed on a wafer. Each of the surface-emitting laser devices includes a layer structure formed on a substrate, the layer structure including an active layer, where a layer portion including at least the active layer from among the layer structure is formed in a mesa-post, and a top surface of a peripheral area disposed around the mesa-post is higher than a top surface of the mesa-post, a first electrode formed on the top surface of the mesa-post, a first pad electrode provided on the top surface of the peripheral area, where the first electrode and the first pad electrode are electrically connected to each other, a second electrode formed on a surface of a lower cladding layer that is formed between the substrate and the active layer, and a second pad electrode formed on the top surface of the peripheral area, where the second electrode and the second pad electrode are electrically connected to each other. The method includes causing a plurality of first contact electrodes arranged in a same plane with a pitch same as that of the surface-emitting laser devices to have contact with first pad electrodes of the surface-emitting laser devices, respectively, the first contact electrodes being electrically connected to each other, causing a plurality of second contact electrodes arranged in a same plane with a pitch same as that of the surface-emitting laser devices to have contact with second pad electrodes of the surface-emitting laser devices, respectively, the second contact electrodes being electrically connected to each other, and applying a current to the first contact electrodes and the second contact electrodes.

According to a tenth aspect of the present invention, the method further includes perfoming the wafer level burn-in test, while heating the wafer to a predetermined temperature.

According to an eleventh aspect of the present invention, the method further includes monitoring laser lights emitted respectively from the surface-emitting laser devices during the wafer level burn-in test.

According to a twelfth aspect of the present invention, there is provided a device for performing a wafer level burn-in test for a plurality of surface-emitting laser devices formed on a wafer. Each of the surface-emitting laser devices includes a layer structure formed on a substrate, the layer structure including an active layer, where a layer portion including at least the active layer from among the layer structure is formed in a mesa-post, and a top surface of a peripheral area disposed around the mesa-post is higher than a top surface of the mesa-post, a first electrode formed on the top surface of the mesa-post, a first pad electrode provided on the top surface of the peripheral area, where the first electrode and the first pad electrode are electrically connected to each other, a second electrode formed on a surface of a lower cladding layer that is formed between the substrate and the active layer, and a second pad electrode formed on the top surface of the peripheral area, where the second electrode and the second pad electrode are electrically connected to each other. The testing device includes a first substrate including a plurality of first contact electrodes arranged with a pitch same as that of the first pad electrodes of the surface-emitting laser devices and electrically connected to each other and a plurality of second contact electrodes arranged with a pitch same as that of the second pad electrodes of the surface-emitting laser devices and electrically connected to each other and a power supply unit that applies a current to the first pad electrodes and the second pad electrodes in a condition that the first contact electrodes have contact with the first pad electrodes of the surface-emitting laser devices and the second contact electrodes have contact with the second pad electrodes of the surface-emitting laser devices.

According to a thirteenth aspect of the present invention, the device further includes a stage having a function of controlling temperature for heating the wafer at the predetermined temperature.

According to a fourteenth aspect of the present invention, the device further includes a plurality of light-receiving elements for respectively monitoring laser lights emitted from the surface-emitting laser devices.

According to the present invention, it is possible to screen reliability failures of surface-emitting laser devices at wafer level in a collective manner, without inflicting a damage on a mesa-post including an active layer.

Furthermore, according to the present invention, it is possible to inspect lightning of a plurality of surface-emitting laser devices at wafer level.

BRIEF DESCRIPTION OF THE DRAWINGS

FIG. 7 is a sectional view of a VCSEL device and a laser array according to a third embodiment of the present invention.

FIG. 11 is a view for explaining problems encountered in the polishing process and testing process for the conventional VCSEL device.

BEST MODES FOR IMPLEMENTING THE INVENTION

The VCSEL device of the present invention features in the first aspect that the top surface of the dielectric film formed in the peripheral area disposed outside the mesa-post is located at a higher position compared to the top surface of the mesa-post. The VCSEL device features in the second aspect thereof that the VCSEL device has a pad terminal formed on the surface of the peripheral area disposed outside the mesa-post and electrically connected to the said mesa-post terminal, wherein the surface of the pad terminal is located at a higher position compared to the mesa-post terminal.

The VCSEL device of the present invention is applicable to the structure wherein an annular groove is formed between the mesa-post and the layer portion of the peripheral area, the annular groove having a side surface configuring a side surface of the layer portion of the mesa-post.

It is a preferable embodiment of the present invention that the dielectric film has a thickness of d2 in an area between the top surface of the mesa-post and the layer portion of the peripheral area, a maximum thickness of the dielectric film in the peripheral area is d1, and the following relationship $0 \leq d2 < d1$ holds. In this case, an external stress applied to the peripheral area is reduced during transferring to the mesa-post via the dielectric film, thereby protecting the mesa-post against the external force.

In the above case, if employed, it is also preferable that the dielectric film have a thickness of d3 in another area between the area in which the dielectric film has the thickness of d2 and the top surface of the mesa-post, and the following relationship $0 \leq d2 < d3$ holds. In this case, the portion of the dielectric film having a larger thickness of d3 protects the sidewall etc. of the mesa-post against the external force.

The dielectric film may be made of an organic resin, for example, made of polyimide. In an alternative, the dielectric film may be made of SiNx or SiOx. These different dielectric films may be layered one on another.

The top DBR mirror may be a dielectric DBR mirror. In this case, a film configuring the dielectric DBR mirror may cover the entire mesa-post and configure a dielectric film formed in the peripheral area, or the dielectric film may cover the peripheral area.

Instead of the configuration wherein the VCSEL device is connected to an external electrode at the position of the ring electrode, a pad terminal connected to the ring electrode is formed in the peripheral area, and the pad electrode and external electrode area connected together. In this case, the contact or pressure occurring during connecting the VCSEL device to the external terminal is reduced. The pad terminal may be preferably formed on the dielectric film covering the peripheral area.

Hereinafter, embodiments of the present invention will be described concretely in detail with reference to accompanying drawings while exemplifying the embodiments.

(Embodiment 1)

Figure 1:
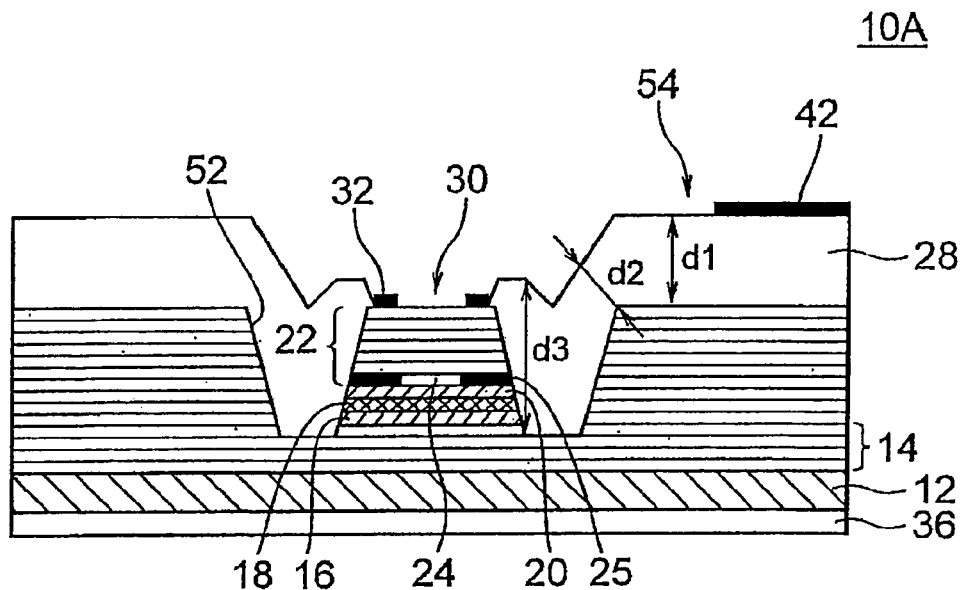
FIG. 1 is sectional view of a VCSEL device according to a first embodiment of the present invention.

FIG. 1 shows a VCSEL device according to a first embodiment of the present invention. In the VCSEL device 10 shown in FIG. 1, the layer structure is formed on an n-type substrate, differently from the conventional VCSEL device 10A wherein the layer structure is formed on a p-type substrate. More specifically, the VCSEL device 10 of the present embodiment has, on an n-GaAs substrate 12, a semiconductor layer structure including: an n-type bottom DBR mirror including 35 n-$Al_{0.9}$GaAs/n-$Al_{0.2}$GaAs layer pairs each having a thickness of $\lambda/4n$ in each layer; a lower cladding layer 16, a quantum-well active layer 18; an upper cladding layer 20, a confinement oxide layer comprised of AlAs layer 24 and Al-oxide layer 25; and a p-type top DBR mirror 22 including 25 p-$Al_{0.9}$GaAs/p-$Al_{0.2}$GaAs layer pairs each having a thickness of $\lambda/4n$ in each layer.

The central portion on the substrate surface is configured as a mesa-post 30. The mesa-post 30 is separated from the peripheral area 54 by an annular groove which is formed in the layer structure while extending from the top surface of the layer structure to a portion of the bottom DBR mirror. The width of the annular groove 52 is around 5.0 to 30 μm, whereas the height of the mesa-post 54 or the depth of the annular groove 52 is around 3 to 7 μm. A polyimide film 28 is formed on the semiconductor layer structure in the peripheral area 54, wherein the layer structure of the mesa-post 30 is different from the layer structure of the peripheral area 54 only in the structure of the polyimide film 28.

In the VCSEL device 10 having the above structure, the semiconductor layer structure is deposited similarly to the conventional fabrication method except for the difference between the n-type and the p-type. After deposition of the semiconductor layers, the annular groove 52 is formed extending from the layer surface to a portion of the bottom DBR mirror 14 by using a photolithographic and etching process, thereby configuring the mesa-post 30. The entire surface of the wafer on which the mesa-post 30 is formed is coated with polyimide, which is subjected to a needed heat treatment to form a polyimide film 28. Thereafter, a photolithographic process is conducted to remove a portion of the polyimide film 28 in an area corresponding to at least top surface of the mesa-post 30 and wider than the top surface of the mesa-post 30. In this step, the polyimide film 28 has convex and concave portions thereon due to a difference in the amount of contraction thereof depending on the thickness of the polyimide film 28. This is likely to cause a protruding shape on the thin polyimide film 28 in a peripheral portion surrounding the top surface of the mesa-post 30. In this case either, the height of the surface of the polyimide film 28 in the peripheral area 54 is higher than the mesa-post 30 including the polyimide film 28. After the etch of the polyimide film 28, p-side electrode 32 and n-side electrode 36 area formed on the top surface of the mesa-post 30 and the bottom surface of the substrate 12, respectively.

The pad electrode 42 disposed on the peripheral area 54 is located on a higher position compared to the position of the ring electrode 32 disposed on the mesa-post 30. It is to be noted here that the "higher position" means a larger distance with respect to the surface of the substrate 12. The ring electrode 32 and pad electrode 42 are electrically connected together by an evaporated metallic film formed on the polyimide film 28, for example. Since the mesa-post 30 is configured by formation of the annular groove 52 as described heretofore, the layers of the mesa-post 30 and the layers of the peripheral area 54 outside the annular groove 52 have an equal height, whereby the structure wherein the top surface of the polyimide film 28 on the peripheral area 54 is higher than the top surface of the mesa-post 30 can be easily obtained.

The structure wherein the VCSEL device has a mesa-post 30 lower than the top surface of the polyimide film 28 reduces unnecessary contacts with respect to the probe or jig etc. during the testing process or working process such as the substrate polishing.

In the present embodiment, assuming that the maximum thickness of the polyimide film 28 on the surface of the peripheral area 54 is d1 as shown in FIG. 1, the thickness d2 of the polyimide film 28 in the vicinity of the outer sidewall of the annular groove 52 is smaller than d1. In addition, the thickness d2 is smaller than the thickness d3 of the polyimide film within the annular groove 52. More specifically, the polyimide film 28 is formed to have a large thickness d1 in the area from the peripheral area 54 toward the central mesa-post 30, then a smaller thickness d2, and again a larger thickness d3 in the inner area due to an increase toward the inner area. In other word, the polyimide film 28 has a depressed portion sandwiched between both larger-thickness areas. Due to having such a depressed portion, the stress transferred to the mesa-post 30 is reduced when the stress is applied to the polyimide film in the peripheral area 54. For example, the thickness d2 of the depressed portion of the polyimide film 28 is around 1 to 3 μm. The thickness d1 of the polyimide film 28 in the peripheral area 54 is around 4 to 10 μm. It is to be noted however that the surface of the polyimide film 28 having the thickness d1 in the peripheral area 54 is located on the higher position compared to the mesa-post 30 irrespective of the larger thickness d3.

If the thickness d3 of the polyimide film 28 in the peripheral area is excessively small, it is impossible to provide a sufficient difference between the same and the thickness d2 of the depressed portion. In addition, if the depressed portion has an excessively larger thickness, it is impossible to sufficiently prevent the transfer of the stress. In the present invention, fabrication of such a structure is easily achieved if the vertical interval between the ring electrode 32 and the pad terminal 42 is relatively small and the conductor for communicating together the ring electrode 32 and the pad terminal 42 is formed as by evaporation.

Figure 2:
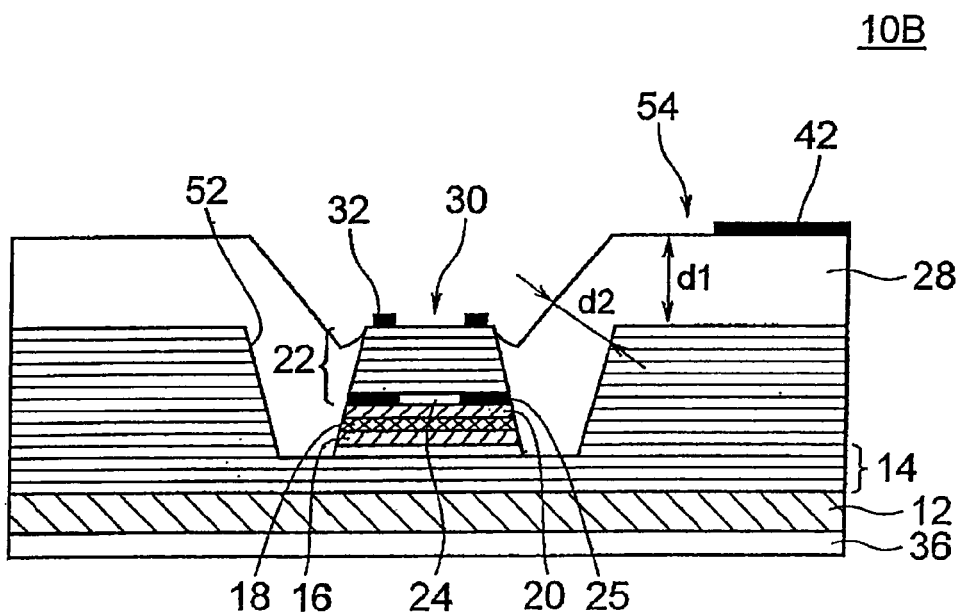
FIG. 2 is a sectional view of a first modified example modified from the VCSEL device of FIG. 1.

FIG. 2 shows a VCSEL device 10B according to a first modification of the above embodiment. In this modification exemplified, a portion of the polyimide film 28 overhanging the top surface of the mesa-post 30 is removed. The other configurations are similar to those of the embodiment of FIG. 1.

Figure 3:
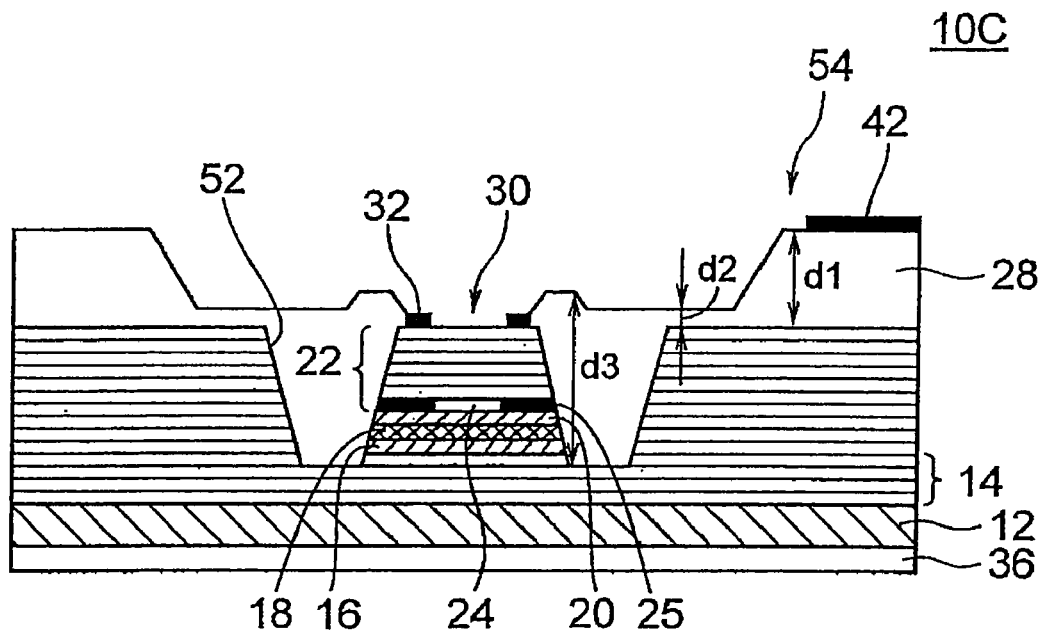
FIG. 3 is a sectional view of a second modified example modified from the VCSEL device of FIG. 1.

FIG. 3 shows a VCSEL device 10B according to a second modification of the above embodiment. In this modification exemplified, the depressed portion of the polyimide film 28 formed in the vicinity of the outer periphery of the annular groove 52 is replaced by an area of the polyimide film 28 having a small thickness d1 in the vicinity of the inner edge of the peripheral area 54 to thereby configure a depressed portion in the polyimide film 28. It is to be noted that d2 shown in FIG. 3 may be zero. The other configurations are similar to those in the embodiment of FIG. 1.

Figure 4:
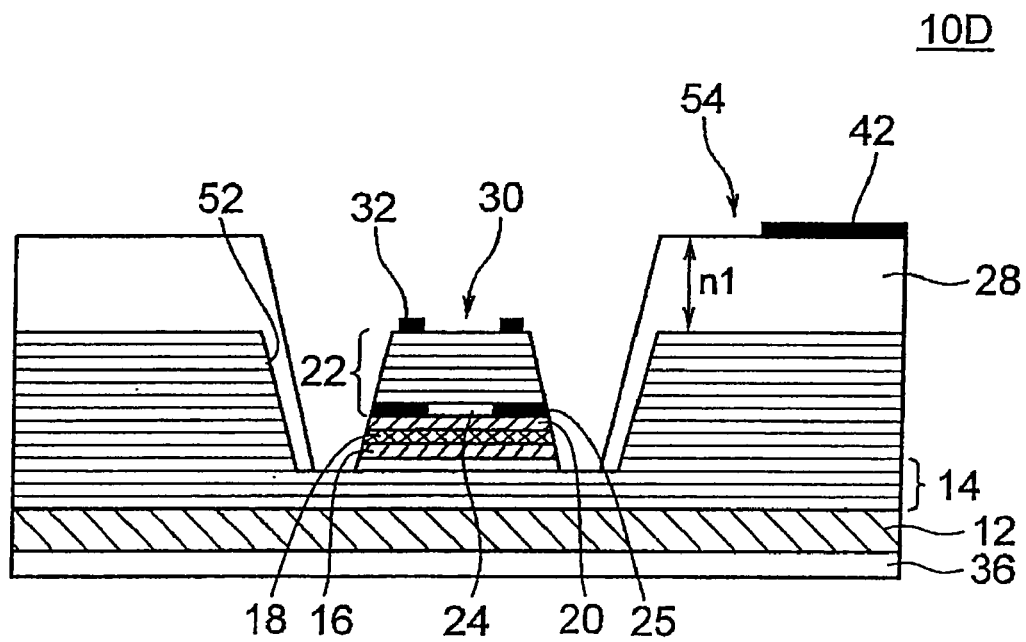
FIG. 4 is a sectional view of a third modified example modified from the VCSEL device of FIG. 1.

FIG. 4 shows a VCSEL device 10D according to a third modification of the embodiment of FIG. 1. In this modification exemplified, the polyimide film 28 is not formed on the top and side surfaces of the mesa-post and most of the internal of the annular groove 52, and the polyimide film 28 is formed only in an outer portion of the annular groove 52.

Figure 5:
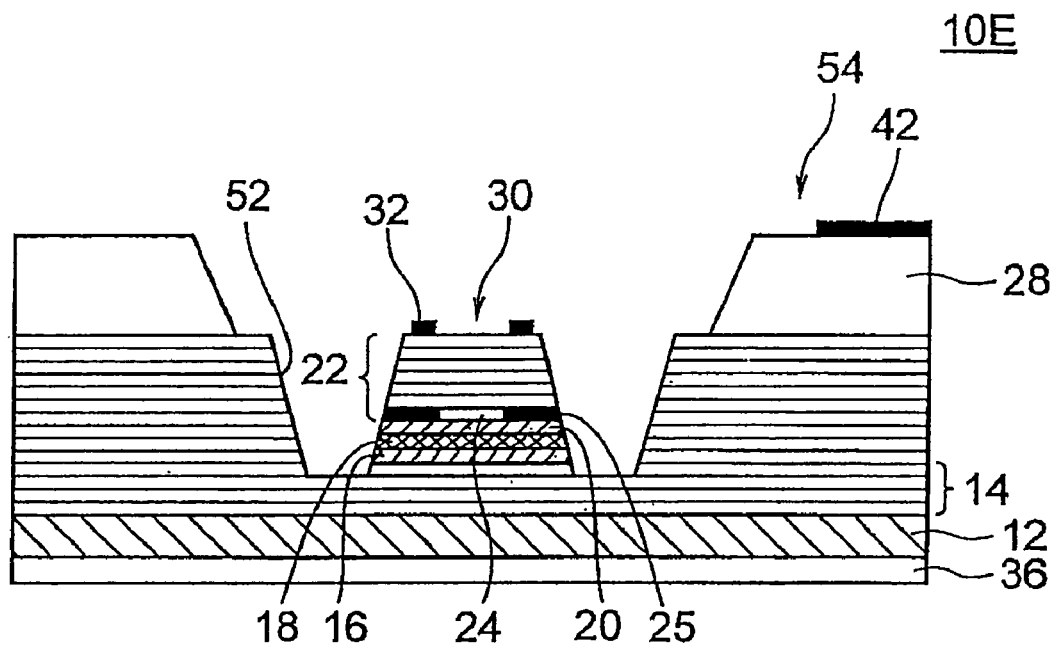
FIG. 5 is a sectional view of a fourth modified example modified from the VCSEL device of FIG. 1.

FIG. 5 shows a VCSEL device 10E according to a fourth modification of the embodiment of FIG. 1. In this modification exemplified, the polyimide film 28 is not formed on the top and side surfaces of the mesa-post 30 and the internal of the annular groove 52, and there is an area in the vicinity of the inner edge of the peripheral area 54, the area being such that the polyimide film 28 is not formed therein.

In the VCSEL devices according to the embodiment of the present invention and the modification, the configuration is shown wherein the top surface of the peripheral area 54 is located at a higher position compared to the top surface of the mesa-post 30 by using the polyimide film 28 as the dielectric film. However, the dielectric film is not limited to the polyimide film, and may be other dielectric materials, and a SixN film or SixOy film may be formed in the peripheral area to have a larger height compared to the mesa-post.

(Embodiment 2)

Figure 6:
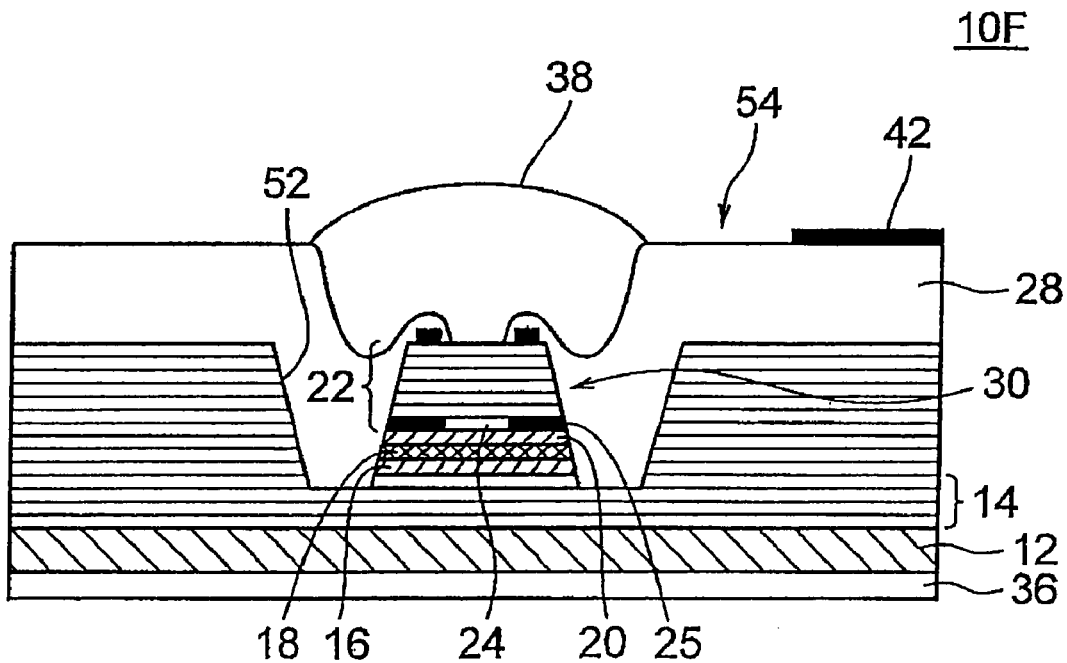
FIG. 6 is a sectional view of a VCSEL device according to a second embodiment of the present invention.

FIG. 6 shows a VCSEL device according to a second embodiment of the present invention. In the present embodiment, a resin lens 38 is formed on the top surface of the mesa-post of the VCSEL device of the embodiment shown in FIG. 1. The resin lens 38 is formed on the surface of the polyimide film 28 overlying the mesa-post 30 and the annular groove 52 by taking advantage of the depressed shape of the polyimide film 28, configuring a domed top surface. In the present embodiment, the size of the depressed portion of the polyimide film 28 is appropriately selected, to allow a suitable size of the resin lens 38 to be easily obtained, without the necessity of alignment of the VCSEL device with respect to the lens. In addition, formation of the resin lens 30 directly on the mesa-post 30 allows the optical system, which optically couples the VCSEL device with an optical fiber, to be formed in a smaller size, and obtains a function of protecting the top surface of the mesa-post 30 by the resin lens 30.

The structure of the VCSEL device of the present invention is applicable to a laser array, in which VCSEL devices are arranged in a two-dimensional array on a common substrate for integration. In particular, the configuration of the VCSEL device of the present invention reduces the damage incurred in the polishing process, testing process etc., thereby providing a higher reliability which is generally required for all the plurality of VCSEL devices integrated.

(Embodiment 3)

FIGS. 7(a) and (b) are side views respectively showing a VCSEL device 10G according to a third embodiment of the present invention and a laser array 50 wherein such VCSEL devices 10G are arranged in a two-dimensional array on a common substrate for integration. As depicted in FIG. 7(a), in the VCSEL device 10G of the present embodiment, the top DBR mirror is configured as a dielectric DBR mirror 46, and the entire surface of the mesa-post 30 and dielectric film 28 is covered by a film configuring the dielectric DBR mirror 46 to obtain the structure.

On a semi-insulating substrate 13 is formed a bottom DBR mirror 14 configured by semiconductor layers, on which an n-type lower cladding layer 56, active layer 18 and a p-type semiconductor cladding layer 58 are formed, wherein these lower cladding layer 56, active layer 18 and upper cladding layer 58 are left as a layer portion in the peripheral area. A dielectric film 28 made of polyimide is formed to cover this layer portion in the peripheral area, and the dielectric film 28 is covered by a film configuring the dielectric DBR mirror 46. The surface of the peripheral area is formed to be higher than the top surface of the mesa-post 30. The dielectric DBR mirror 46 is configured by a layer structure including a plurality of pairs each including an amorphous silicon and a silicon oxide in pair, or a layer structure including a plurality of pairs each including a silicon oxide film and a silicon nitride film in pair.

In the mesa-post 30, an n-side electrode 36A is formed on a surface portion of the lower cladding layer 56, and is connected to the n-side pad electrode 48 formed on the film configuring the DBR mirror 46 in the peripheral area. Similarly, the p-side electrode 32 configuring the ring electrode is connected to the p-side electrode 42 formed on the film configuring the DBR mirror 46 in the peripheral area. These pad electrodes 42, 48 are made from an Au film, for example.

As shown in FIG. 7(b), a large number of VCSEL devices 10G having the above configuration are formed on a common substrate 12 to configure the laser array 50. Due to the peripheral area of the VCSEL devices being higher the mesa-post 30, and also due to the dielectric DBR mirror 46 covering the entire device, damage applied to each of the laser devices is reduced during the polishing process, testing process etc.
(Embodiment 4)

Figure 8:
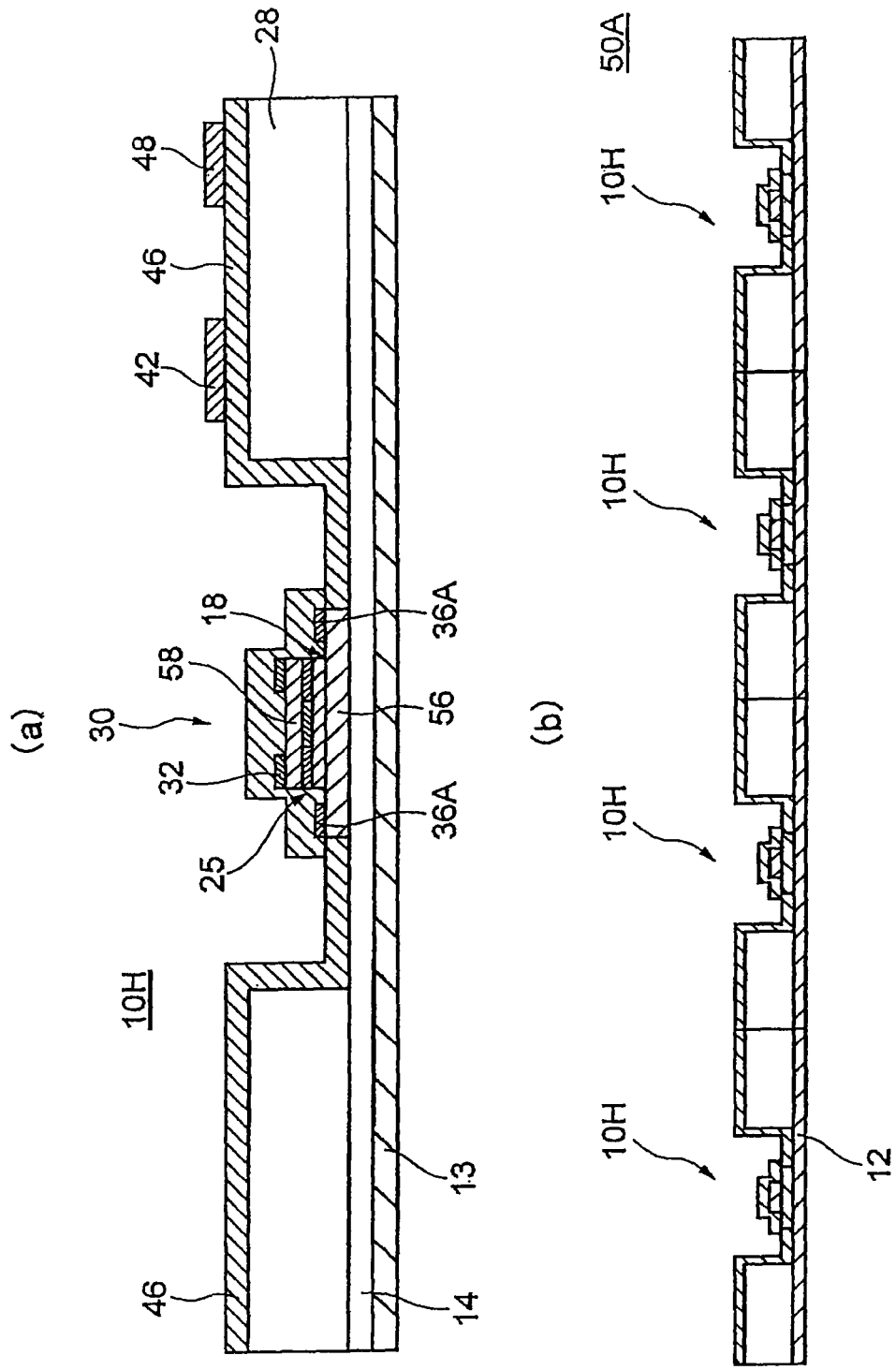
FIG. 8 is a sectional view of a VCSEL device and a laser array according to a fourth embodiment of the present invention.

FIG. 8 shows a VCSEL device 10H according to a fourth embodiment of the present invention and a laser array 50A, similarly to FIG. 7. The VCSEL device 10H of the present embodiment is different from the VCSEL device 10G of the third embodiment in that the layer portion of the peripheral area is entirely removed in the present embodiment. The dielectric film 28 such as polyimide is formed to have a larger thickness in the layer portion thus removed. The laser array 50A is such that a larger number of VCSEL devices having the above structure are disposed on a common substrate 12.
(Embodiment 5)

Figure 9:
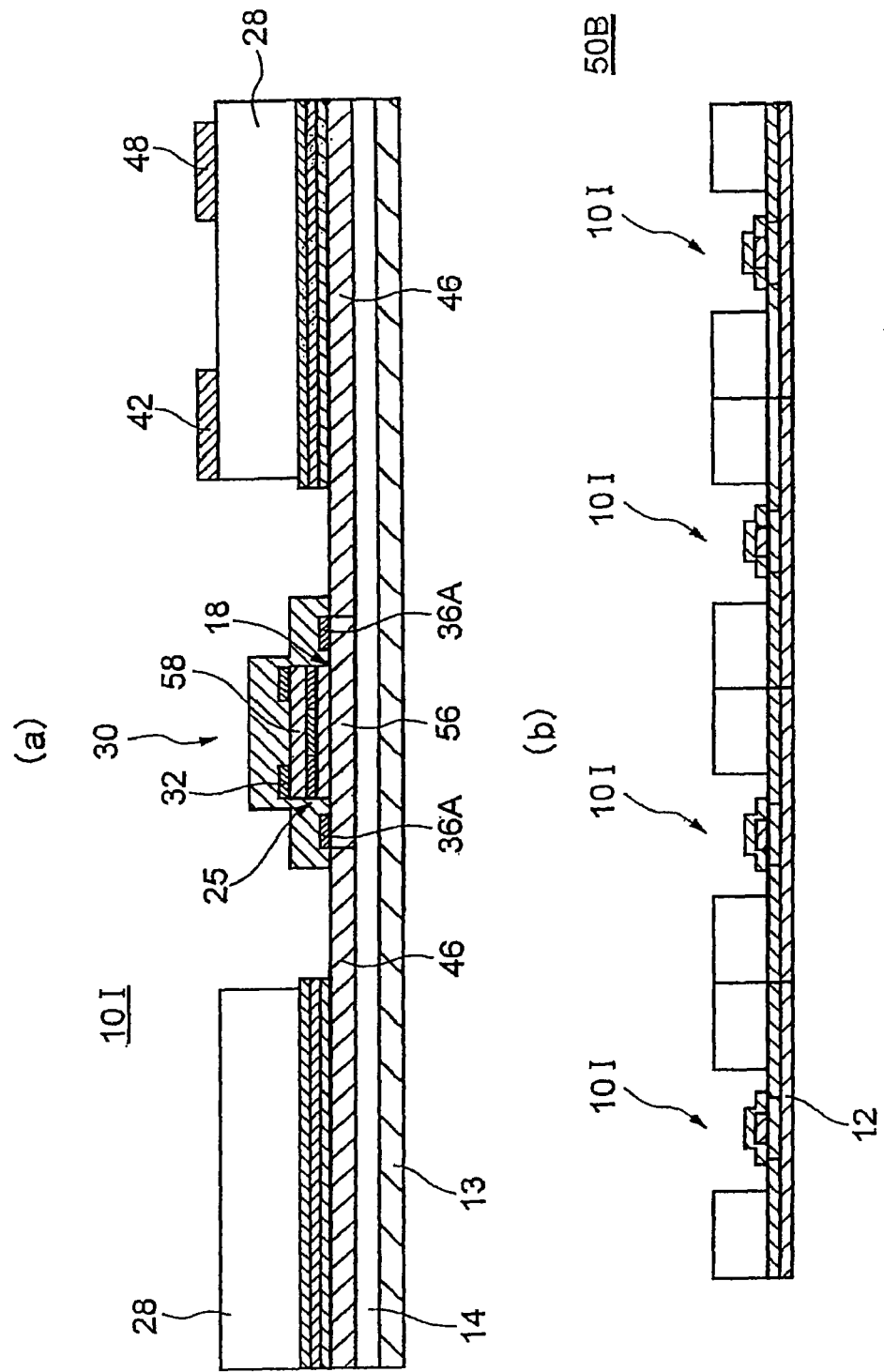
FIG. 9 is a sectional view of a VCSEL device and a laser array according to a fifth embodiment of the present invention.
Figure 10:
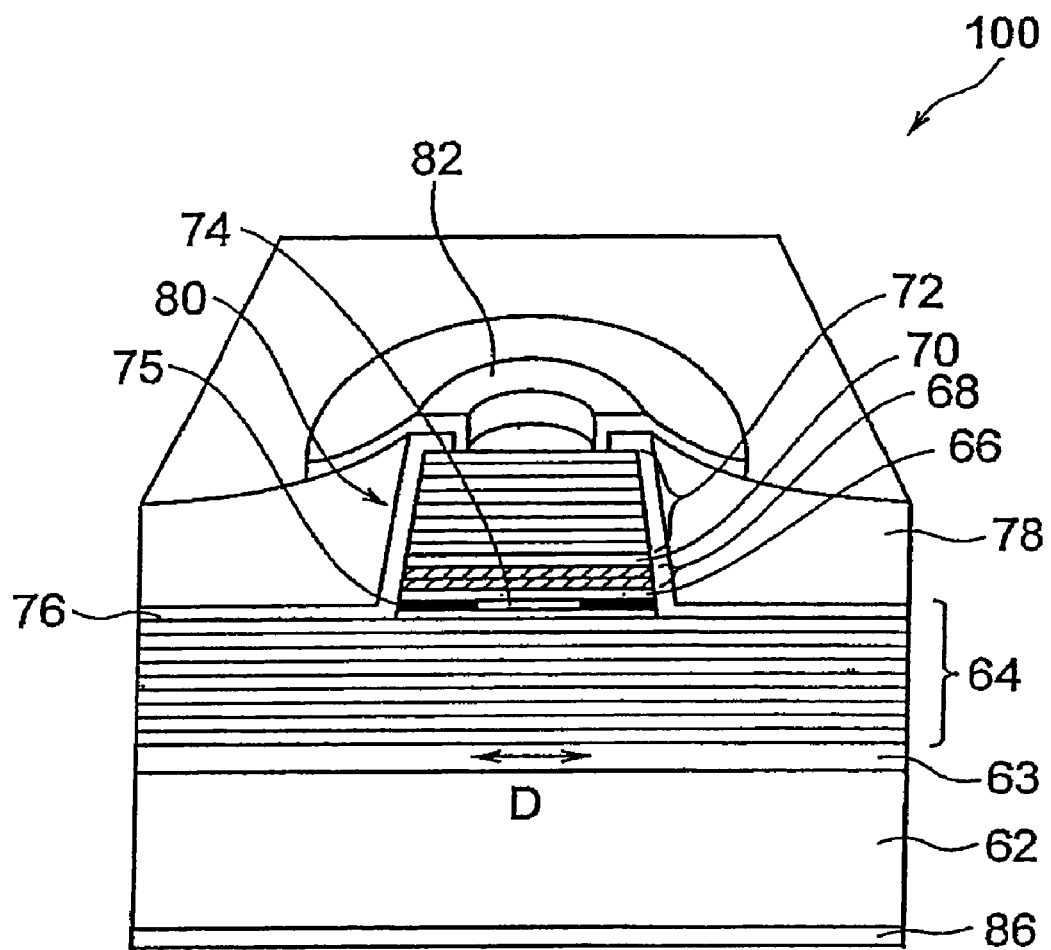
FIG. 10 is a perspective sectional view of a conventional VCSEL device.

FIG. 9 shows a VCSEL device 10I according to a fifth embodiment of the present invention and a laser array 50B, similarly to FIG. 7. The VCSEL device 10I of the present embodiment is different from the VCSEL device 10G of the embodiment shown in FIG. 8 in that the film configuring the dielectric DBR mirror 46 is covered by the dielectric film 28 such as polyimide formed in the peripheral area. The dielectric DBR mirror 46 is formed to cover the entire surface of the mesa-post 30. The n-side pad electrode 48 and p-side pad electrode 42 are formed on a surface portion of the dielectric film 28.

It is to be noted that although VCSEL device and laser array formed on an n-type substrate are exemplified in the above embodiments, the substrate used may be any of n-type and p-type ones, and that the p-type and n-type are reversed from the above embodiments if the VCSEL device is formed on the p-type substrate.

Although the present invention is described with reference to the preferred embodiments, the VCSEL device of the present invention is not limited to the above embodiments, and a variety of modifications or alterations from the above embodiments will fall within the scope of the present invention.

Hereinafter, a testing method of surface-emitting laser devices according to a first embodiment of the present invention will be described.

The testing method is used for a first type of a surface-emitting laser device having the following structure, such as the surface-emitting laser device 10 shown in FIG. 1.

(a) The surface-emitting laser device comprises a layer structure including an active layer 18, wherein a layer portion including at least the active layer 18 of the layer structure is configured as a mesa-post 30.

(b) A top surface of a peripheral area 54 disposed outside the mesa-post 30 is located at a higher position compared to a top surface of the mesa-post 30.

(c) A p-side ring electrode (a first electrode) 32 formed on the top surface of the mesa-post 30 is electrically connected with a pad electrode 42 provided on the top surface of the peripheral area 54.

(d) An n-side electrode (a second electrode) 36 is formed on the bottom surface of an n-side substrate (a substrate) 12 on which the layer structure is formed.

Also, the testing method could be used for a surface-emitting laser device in which an n-side ring electrode (a first electrode) is formed on the top surface of the mesa-post 30 and a p-side electrode (a second electrode) is formed on the bottom surface of a p-side substrate (a substrate).

Figure 15:
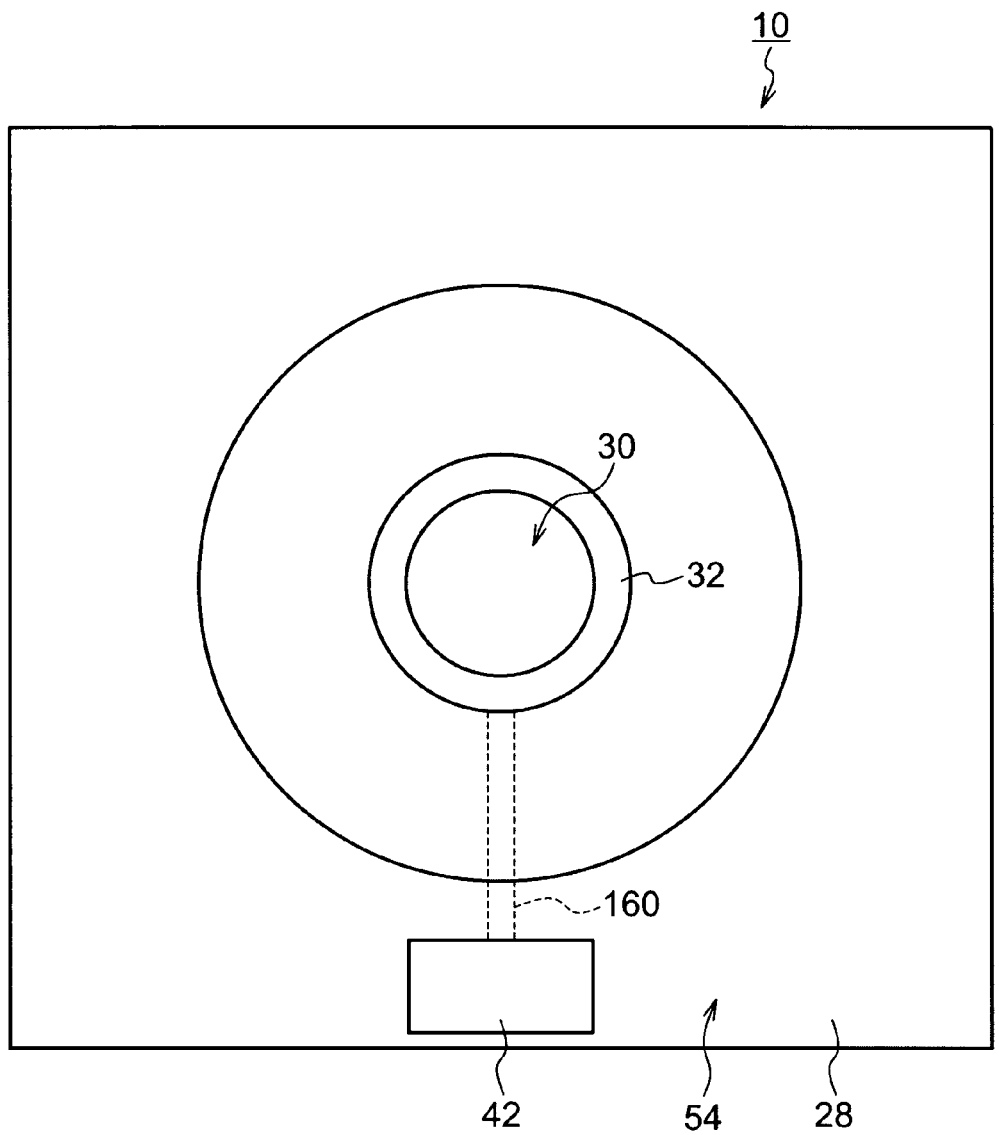
FIG. 15 is an enlarged plan view of one of the surface-emitting laser devices formed on the wafer shown in FIG. 13.

And, in the first type of a surface-emitting laser device such as the surface-emitting laser device 10 shown in FIG. 1, the p-side ring electrode (the first electrode) 32 formed on the top surface of the mesa-post 30 and the pad electrode 42 formed on the top surface of the peripheral area 54 are electrically connected by a metal layer 160 formed on the surface of the layer structure of a semiconductor which is formed on the n-side substrate 12, as shown in FIG. 15. The metal layer 160 is covered with the polyimide film 28.

Figure 13:
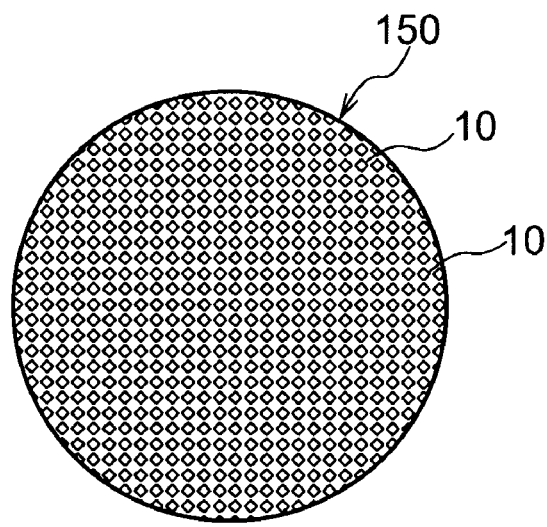
FIG. 13 is a plan view of a wafer formed with a plurality of surface-emitting laser devices.

The testing method according to a first embodiment of the present invention is a method of performing a wafer level burn-in test for a plurality of surface-emitting laser devices formed on a wafer 150 shown in FIG. 13.

The testing method comprises the following steps.

Figure 12:
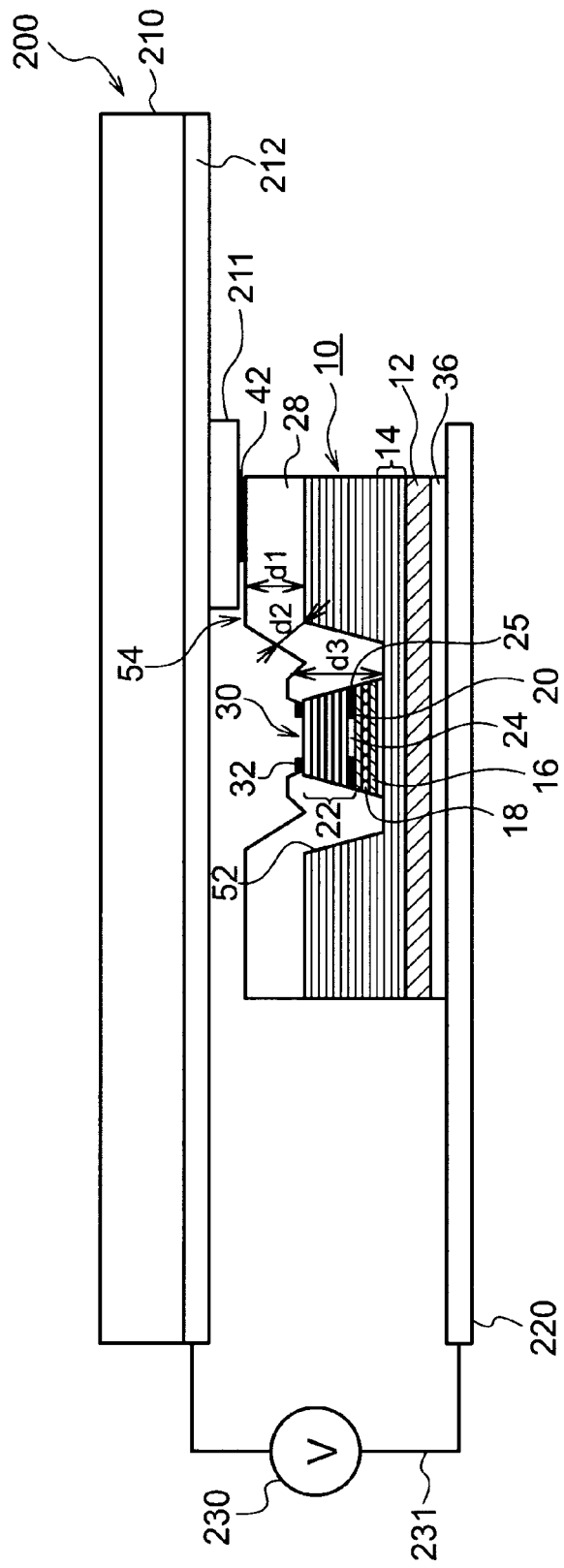
FIG. 12 is a view for explaining a testing method and a testing device of surface-emitting laser devices according to a first embodiment of the present invention.

A step for contacting a plurality of contact electrodes 211, which are disposed at the same pitch as a plurality of surface-emitting laser devices 10 in the same plane and electrically connected with each other, with the pad electrode 42 of a plurality of surface-emitting laser devices 10 respectively, as shown in FIG. 12.

A step for applying electrical current to the n-side electrode (the second electrode) 36 and a plurality of contact electrodes 211.

In the testing method, it is preferred to perform a wafer level burn-in test, while heating the wafer 150 at a predetermined temperature.

In the testing method, it is further preferred to monitor laser lights 60 (see FIG. 18) emitted respectively from a plurality of surface-emitting laser devices 10, during the wafer level burn-in test.

Hereinafter, a testing device 200 which is used for the testing method of surface-emitting laser devices according to a first embodiment of the present invention will be described with reference to FIG. 12-FIG. 16.

The testing device 200 comprises three parts including a first substrate 210, a wiring plate 220 and a battery 230.

Figure 14:
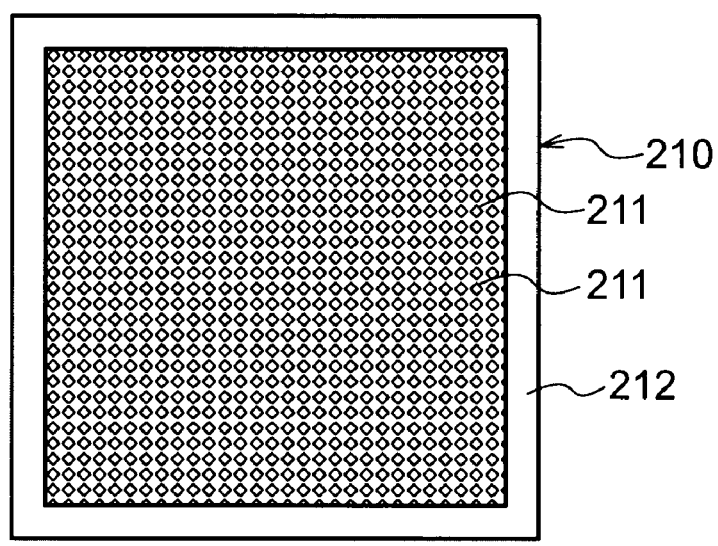
FIG. 14 is a plan view of a glass substrate used for the device shown in FIG. 12.
Figure 16:
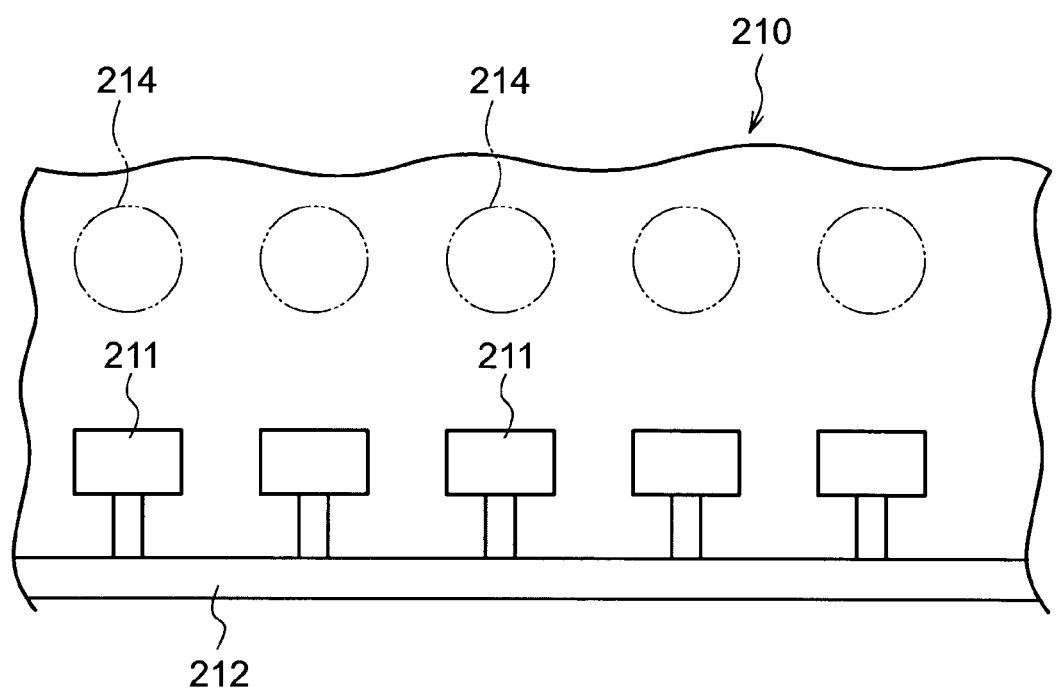
FIG. 16 is an enlarged plan view of a portion of the glass substrate shown in FIG. 14.

The first substrate 210 is a transparent substrate such as a glass substrate and a plastic substrate. On the first substrate 210, as shown in FIG. 14 and FIG. 16, it is formed with a plurality of contact electrodes 211, which are disposed at the same pitch as a plurality of surface-emitting laser devices 10 in the same plane and electrically connected with each other. A plurality of contact electrodes 211 are electrically connected with a wiring electrode 212.

On the wiring plate 220, it is formed with a wiring electrode (wiring electrode layer) which contacts at the same time with all n-side electrodes 36 of a plurality of surface-emitting laser devices 10.

And, the battery 230 is electrically connected with the wiring electrode 212 of the first substrate 210 and the wiring electrode of wiring plate 220 through an electrical wire 231. It is preferred to provide an on/off switch in the electrical wire 231.

In the case of performing the wafer level burn-in test for a plurality of surface-emitting laser devices 10 formed on a wafer 150 by the testing device 200, as shown in FIG. 12, a plurality of contact electrodes 211 are contacted with the pad electrodes 42 of a plurality of surface-emitting laser devices 10 respectively and the wiring electrode of the wiring plate 220 is contacted with n-side electrodes 36 of a plurality of surface-emitting laser devices 10.

In this situation, electrical current is applied to n-side electrodes 36 of a plurality of surface-emitting laser devices 10 and a plurality of contact electrodes 211 by the battery 230. Thereby, electrical current is applied to each of a plurality of surface-emitting laser devices 10 and a wafer level burn-in test which screens at a time reliability failures of surface-emitting laser devices 10 formed on wafer is performed.

A testing condition (Burn-in condition) of performing the above wafer level burn-in test for surface-emitting laser devices 10, is to carry out constant current control of 16 mA (current density=40 KA/cm$^2$) for a predetermined time at a predetermined temperature (for example 120° C.).

Figure 17:
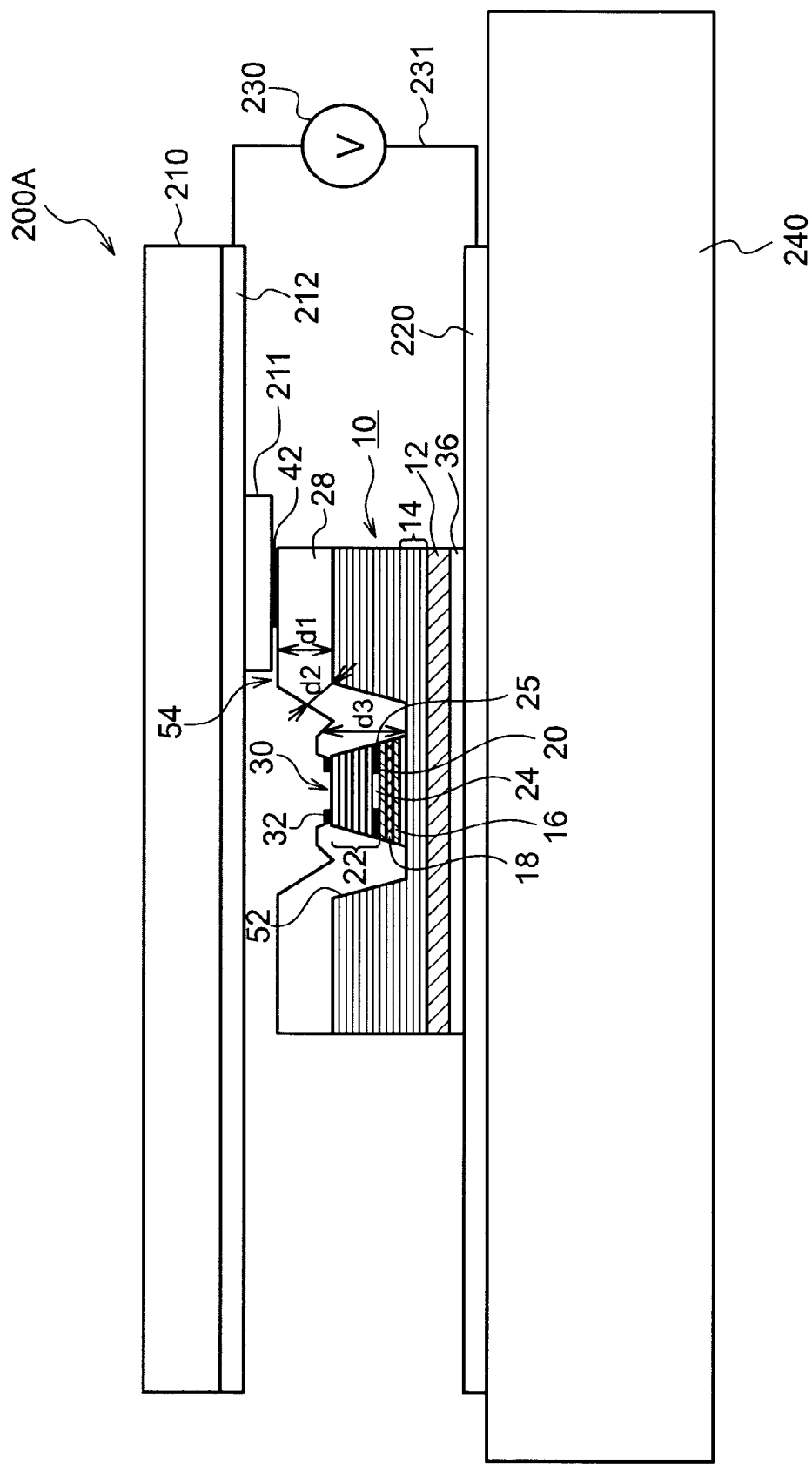
FIG. 17 is a schematic diagram for explaining a device and a method for testing the surface-emitting laser device according to the second embodiment.

In the case of performing the above wafer level burn-in test, while heating the wafer 150 at the predetermined temperature, a testing device 200A according to a second embodiment shown in FIG. 17 is used. In the testing device 200A, there is provided with a stage 240 having a function of controlling temperature for heating the wafer 150 at the predetermined temperature.

Figure 18:
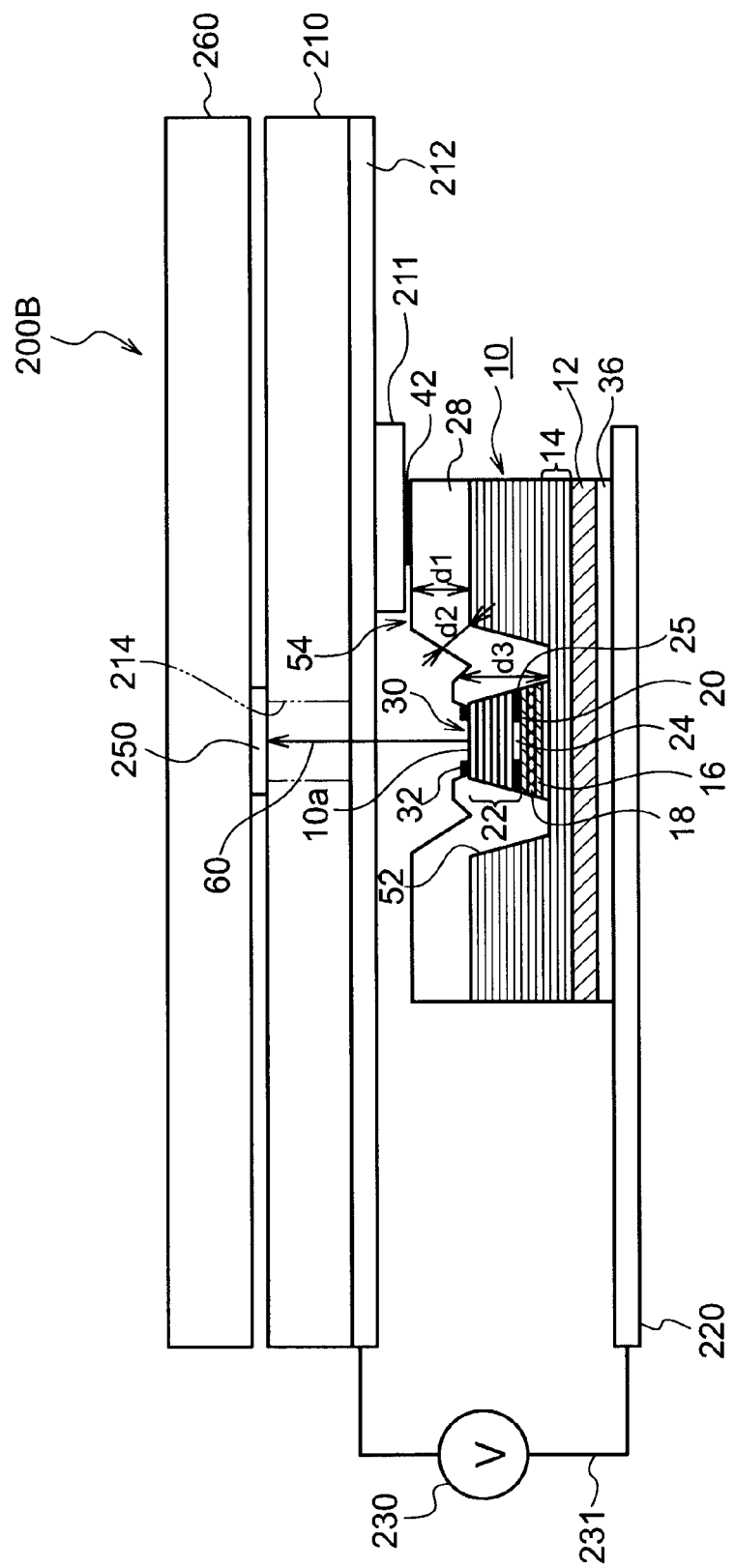
FIG. 18 is a schematic diagram for explaining a device and a method for testing the surface-emitting laser device according to the third embodiment.
Figure 19:
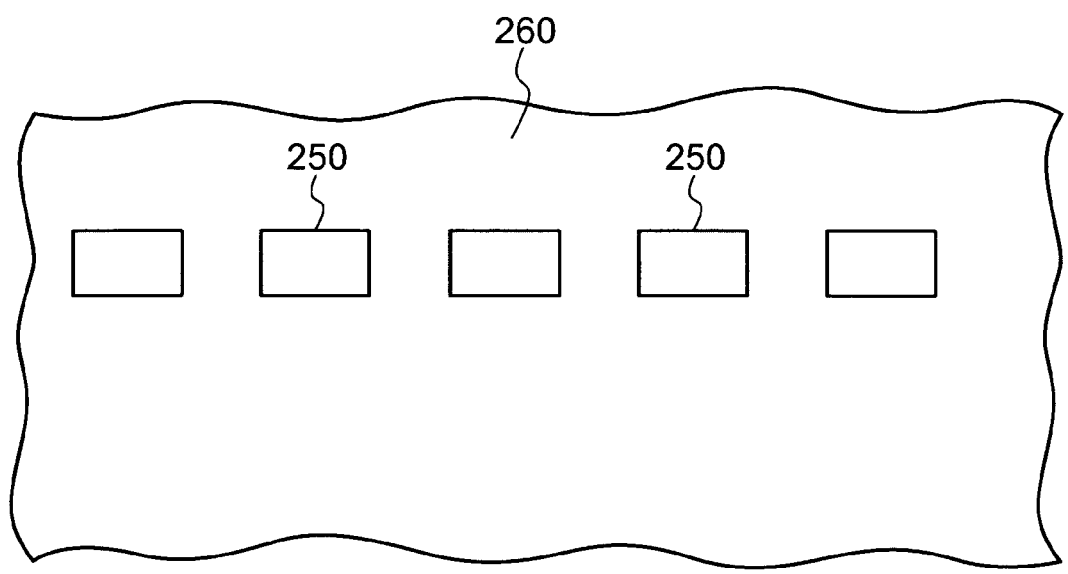
FIG. 19 is an enlarged plan view of a portion of a second substrate shown in FIG. 18.

And, in the case of monitoring laser lights 60 emitted respectively from a plurality of surface-emitting laser devices 10 during the wafer level burn-in test, a testing device 200B according to a third embodiment shown in FIG. 18 is used. In the testing device 200B, there are provided with a plurality of light-receiving elements 250 receiving laser lights 60 emitted from a plurality of surface-emitting laser devices 10 respectively, and a second substrate 260 disposed with a plurality of light-receiving elements 250.

The second substrate 260 is a semiconductor substrate, such as a Si substrate. The second substrate 260 is disposed behind the first substrate 10 as shown in FIG. 18. And, on the second substrate 260, there are provided with a plurality of light-receiving elements 250 which are disposed at the places corresponding to light emitting portions 10$a$ of a plurality of surface-emitting laser devices 10, respectively.

By using the above testing device 200B, it is able to monitor laser lights 60 emitted from light emitting portions 10$a$ of a plurality of surface-emitting laser devices 10 respectively and transmitted through the first substrate 210 which is a transparent substrate, during the wafer level burn-in test.

It is preferred to use an un-transparent substrate such as a glass substrate instead of a transparent substrate such as a semiconductor substrate, for example a glass substrate. In the case of using an un-transparent substrate as the first substrate 210, there are formed in the first substrate 210 with a plurality of through holes 214 at the places corresponding to light emitting portions 10$a$ of a plurality of surface-emitting laser devices 10 respectively. Thereby, it is able to detect laser lights 60 emitted from a plurality of surface-emitting laser devices 10 and transmitted through holes 214 of the un-transparent substrate, during the wafer level burn-in test.

Hereinafter, a testing method of surface-emitting laser devices according to a fourth embodiment of the present invention will be described.

The testing method is used for a second type of a surface-emitting laser device having the following structure, such as the surface-emitting laser device 10G-10I shown in FIG. 7-FIG. 9.

(a) The surface-emitting laser device comprises a layer structure including an active layer 18, wherein a layer portion including at least the active layer 18 of the layer structure is configured as a mesa-post 30.

(b) A top surface of a peripheral area disposed outside the mesa-post 30 is located at a higher position compared to a top surface of the mesa-post 30. Here, "a top surface of a peripheral area" means a top surface of a portion which covers the polyimide film 28 of the dielectric DBR mirror 46 covering the entire surface of the mesa-post 30 and dielectric film (polyimide film) 28.

(c) A p-side ring electrode (a first electrode) 32 formed on the top surface of the mesa-post 30 is electrically connected with a p-side pad electrode 42 provided on the top surface of the peripheral area.

(d) An n-side electrode (a second electrode) 36A formed on a surface of the lower cladding layer 56 which is formed between the semi-insulating substrate 13 on which the layer structure is formed and the active layer 18 is electrically connected with a n-side pad electrode (a second pad electrode) 48 formed on the above top surface of a peripheral area.

Figure 20:
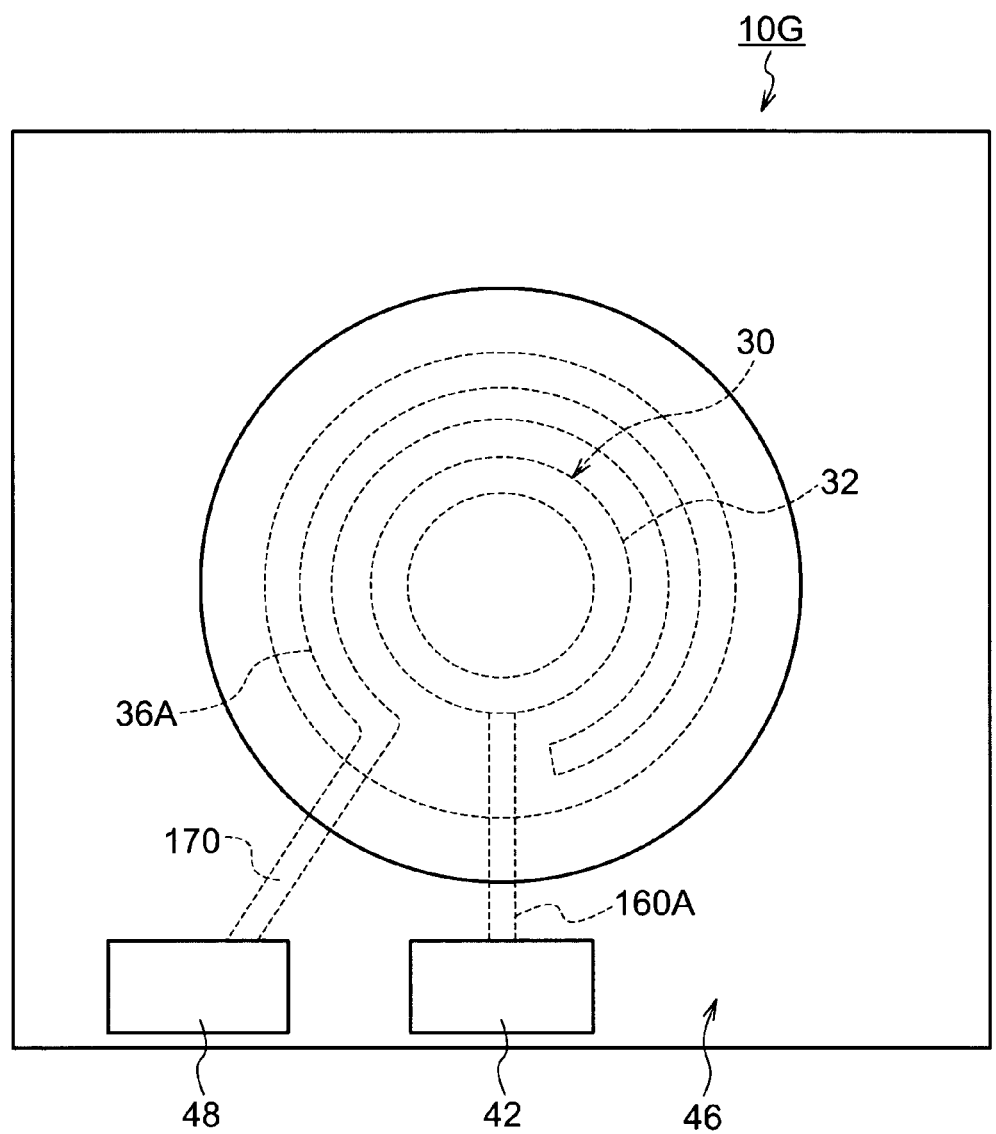
FIG. 20 is a schematic diagram for explaining a device and a method for testing the surface-emitting laser device according to the fourth embodiment.

And, in the second type of a surface-emitting laser device, such as the surface-emitting laser device 10G shown in FIG. 7, as shown in FIG. 20, the p-side ring electrode 32 and the p-side pad electrode 42 are electrically connected by a metal layer 160A which is formed on a surface of a semiconductor-layer structure formed on the semi-insulating substrate 13. And, as shown in FIG. 20, the n-side electrode 36A and the n-side pad electrode 48 are electrically connected by a metal layer 170 which is formed on a surface of the semiconductor-layer structure. The metal layer 170 is covered by the dielectric DBR mirror 46.

A testing method according to a fourth embodiment is a method of performing a wafer level burn-in test for a plurality of surface-emitting laser devices 10G formed on the wafer 150 shown in FIG. 13.

The testing method comprises the following steps.

A step for contacting a plurality of first contact electrodes 270 (FIG. 21) which are disposed at the same pitch as a plurality of surface-emitting laser devices 10G in the same plane and electrically connected with each other, with first pad electrodes 42 (FIG. 7) of a plurality of surface-emitting laser devices 10G, respectively.

A step for contacting a plurality of second contact electrodes 280 (FIG. 21) which are disposed at the same pitch as a plurality of surface-emitting laser devices 10G in the same plane and electrically connected with each other, with second pad electrodes 48 (FIG. 7) of a plurality of surface-emitting laser devices 10G respectively.

A step for applying electrical current to a plurality of first contact electrodes 270 and a plurality of second contact electrodes 280.

In the testing method, it is preferred to perform a wafer level burn-in test, while heating the wafer 150 at a predetermined temperature.

In the testing method, it is further preferred to monitor laser lights 60 (FIG. 18) emitted respectively from a plurality of surface-emitting laser devices 10G, during the wafer level burn-in test.

Figure 21:
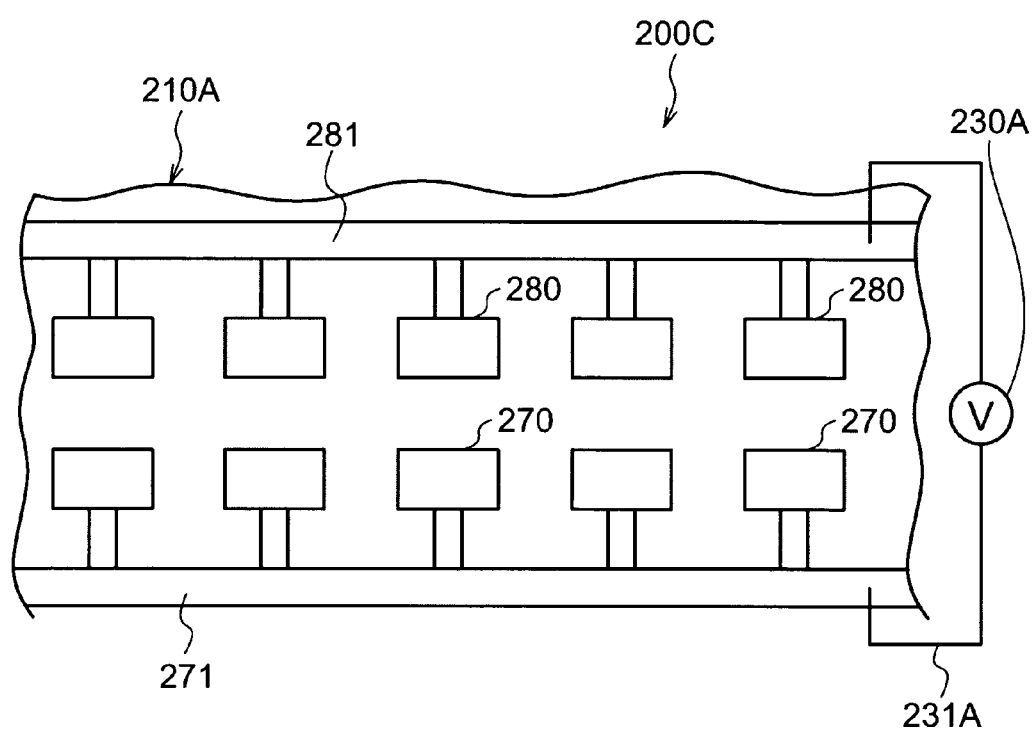
FIG. 21 is a plan view showing a glass substrate used for the device and the method shown in FIG. 20.

A testing device 200C used for the testing method of surface-emitting laser devices according to the above fourth embodiment comprises two parts including a first substrate 210A and a battery 230A shown in FIG. 21.

The first substrate 210A is a transparent substrate such as a glass substrate and a plastic substrate. On the first substrate 210A, as shown in FIG. 21, it is formed with a plurality of first contact electrodes 270 which are disposed at the same pitch as first pad electrodes 42 of a plurality of surface-emitting laser devices 10G formed on the wafer 150 and electrically connected with each other, and a plurality of second contact electrodes 280 which are disposed at the same pitch as second pad electrodes 48 of a plurality of surface-emitting laser devices 10G and electrically connected with each other.

As shown in FIG. 21, a plurality of first contact electrodes 270 are electrically connected with a wiring electrode 271 formed on a first substrate 210A. A plurality of second contact electrodes 280 are electrically connected with a wiring electrode 281 formed on the first substrate 210A.

As shown in FIG. 21, the wiring electrode 271 and the wiring electrode 281 are electrically connected with the battery 230A by an electrical wire 231A. It is preferred to provide an on/off switch in the electrical wire 231A.

In the case of performing a wafer level burn-in test for a plurality of surface-emitting laser devices 10G formed on a wafer 150 by the testing device 200C, a plurality of first contact electrodes 270 shown in FIG. 21 are contacted with first pad electrodes 42 of a plurality of surface-emitting laser devices 10G respectively and a plurality of second contact electrodes 280 are contacted with second pad electrodes 48 of a plurality of surface-emitting laser devices 10G respectively. In this situation, electrical current is applied to a plurality of first contact electrodes 270 and a plurality of second contact electrodes 280 by the battery 230A, thereby electrical current is applied to first pad electrode 42 and second pad electrode 48 of each surface-emitting laser device 10G.

Thereby, electrical current is applied to each of a plurality of surface-emitting laser devices 10G and a wafer level burn-in test which screens at a time reliability failures of surface-emitting laser devices 10G formed on wafer is performed.

A testing condition (Burn-in condition) of performing the above wafer level burn-in test for surface-emitting laser devices 10G, is to carry out constant current control of 16 mA (current density=40 KA/cm$^2$) for a predetermine time at a predetermined temperature (for example 120° C.).

In the case of performing the above wafer level burn-in test, while heating the wafer 150 at the predetermined temperature, same as the testing device 200A shown in FIG. 17, there is provided in the testing device 200C shown in FIG. 21 with a stage having a function of controlling temperature for heating the wafer 150 at the predetermined temperature.

And, in the case of monitoring laser lights 60 (see FIG. 18) emitted respectively from a plurality of surface-emitting laser devices 10G during the wafer level burn-in test, same as the testing device 200B shown in FIG. 18, there are provided in the testing device 200C shown in FIG. 21 with a plurality of light-receiving elements receiving laser lights 60 emitted from a plurality of surface-emitting laser devices 10G respectively, and a second substrate disposed with a plurality of light-receiving elements.

By using the above testing device 200C, it is able to monitor laser lights 60 emitted from light emitting portions 10a of a plurality of surface-emitting laser devices 10G respectively and transmitted through the first substrate 210A which is a transparent substrate, during the wafer level burn-in test.

As the first substrate 210A of the testing device 200C, same as the above first substrate 210 shown in FIG. 16, it is preferred to use an un-transparent substrate such as a semiconductor substrate like a Si substrate, instead of a transparent substrate such as a glass substrate. In the case of using an un-transparent substrate as the first substrate 210A, there are formed in the un-transparent substrate with a plurality of through holes at the places corresponding to light emitting portions 10a of a plurality of surface-emitting laser devices 10G respectively, same as a plurality of through holes 214 shown in FIG. 16. Thereby, it is able to detect laser lights 60 emitted from a plurality of surface-emitting laser devices 10G and transmitted through holes 214 of the un-transparent substrate, during the wafer level burn-in test.

What is claimed is:

1. A method of performing a wafer level burn-in test for a plurality of surface-emitting laser devices formed on a wafer, wherein
    each of the surface-emitting laser devices includes
        a layer structure formed on a substrate, the layer structure including an active layer, wherein a layer portion including at least the active layer from among the layer structure is formed in a mesa-post, and a top surface of a peripheral area disposed around the mesa-post is higher than a top surface of the mesa-post,
        a first electrode formed on the top surface of the mesa-post,
        a pad electrode provided on the top surface of the peripheral area, wherein the first electrode and the pad electrode are electrically connected to each other, and
        a second electrode formed on a bottom surface of the substrate, and the method comprises:
    causing a plurality of contact electrodes arranged in a same plane with a pitch same as that of the surface-emitting laser devices to have contact with pad electrodes of the surface-emitting laser devices, respectively, the contact electrodes being electrically connected to each other; and
    applying a current to second electrodes of the surface-emitting laser devices and the contact electrodes.

2. The method according to claim 1, further comprising heating the wafer to a predetermined temperature.

3. The method according to claim 1, further comprising monitoring laser lights emitted respectively from the surface-emitting laser devices.

4. A method of performing a wafer level burn-in test for a plurality of surface-emitting laser devices formed on a wafer, wherein
    each of the surface-emitting laser devices includes
        a layer structure formed on a substrate, the layer structure including an active layer, wherein a layer portion including at least the active layer from among the layer structure is formed in a mesa-post, and a top surface of a peripheral area disposed around the mesa-post is higher than a top surface of the mesa-post,
        a first electrode formed on the top surface of the mesa-post,
        a first pad electrode provided on the top surface of the peripheral area, wherein the first electrode and the first pad electrode are electrically connected to each other,
        a second electrode formed on a surface of a lower cladding layer that is formed between the substrate and the active layer, and a second pad electrode formed on the top surface of the peripheral area, wherein the second electrode and the second pad electrode are electrically connected to each other, and the method comprises:
causing a plurality of first contact electrodes arranged in a same plane with a pitch same as that of the surface-emitting laser devices to have contact with first pad electrodes of the surface-emitting laser devices, respectively, the first contact electrodes being electrically connected to each other;
causing a plurality of second contact electrodes arranged in a same plane with a pitch same as that of the surface-emitting laser devices to have contact with second pad electrodes of the surface-emitting laser devices, respectively, the second contact electrodes being electrically connected to each other; and
applying a current to the first contact electrodes and the second contact electrodes.

5. The method according to claim 4, further comprising heating the wafer to a predetermined temperature.

6. The method according to claim 4, further comprising monitoring laser lights emitted respectively from the surface-emitting laser devices.

7. A device for performing a wafer level burn-in test for a plurality of surface-emitting laser devices formed on a wafer, wherein
each of the surface-emitting laser devices includes
a layer structure formed on a substrate, the layer structure including an active layer, wherein a layer portion including at least the active layer from among the layer structure is formed in a mesa-post, and a top surface of a peripheral area disposed around the mesa-post is higher than a top surface of the mesa-post,
a first electrode formed on the top surface of the mesa-post,
a pad electrode provided on the top surface of the peripheral area, wherein the first electrode and the pad electrode are electrically connected to each other, and
a second electrode formed on a bottom surface of the substrate, and, and
the device comprises:
a first substrate including a plurality of contact electrodes arranged in a same plane with a pitch same as that of the surface-emitting laser devices, the contact electrodes being electrically connected to each other;
a wiring plate including a wiring electrode having contact with the second electrodes of the surface-emitting laser devices; and
a power supply unit that applies a current to the contact electrodes and the wiring electrode in a condition that the contact electrodes have contact with pad electrodes of the surface-emitting laser devices and the wiring electrode of the wiring plate has contact with the second electrodes.

8. The device according to claim 7, further comprising a stage having a temperature control function of heating the wafer to a predetermined temperature.

9. The device according to claim 7, further comprising a plurality of light-receiving elements for respectively monitoring laser lights emitted from the surface-emitting laser devices.

10. The device according to claim 9, further comprising a second substrate disposed at a back surface side of the first substrate opposite to a surface on which the contact electrodes are formed, wherein the first substrate is a transparent substrate,
the light-receiving elements are disposed on the second substrate at places corresponding to light emitting portions of the surface-emitting laser devices, and
the laser lights emitted from the surface-emitting laser devices and transmitted through the first substrate are detected by the light-receiving elements, respectively.

11. The device according to claim 9, further comprising a second substrate disposed at a back surface side of the first substrate opposite to a surface on which the contact electrodes are formed, wherein
the first substrate is an opaque substrate,
the first substrate includes a plurality of through holes at places corresponding to light emitting portions of the surface-emitting laser devices, and
the laser lights emitted from the surface-emitting laser devices are transmitted through the through holes and detected by the light-receiving elements, respectively.

12. A device for performing a wafer level burn-in test for a plurality of surface-emitting laser devices formed on a wafer, wherein
each of the surface-emitting laser devices includes
a layer structure formed on a substrate, the layer structure including an active layer, wherein a layer portion including at least the active layer from among the layer structure is formed in a mesa-post, and a top surface of a peripheral area disposed around the mesa-post is higher than a top surface of the mesa-post,
a first electrode formed on the top surface of the mesa-post,
a first pad electrode provided on the top surface of the peripheral area, wherein the first electrode and the first pad electrode are electrically connected to each other,
a second electrode formed on a surface of a lower cladding layer that is formed between the substrate and the active layer, and
a second pad electrode formed on the top surface of the peripheral area, wherein the second electrode and the second pad electrode are electrically connected to each other, and
the device comprises:
a first substrate including a plurality of first contact electrodes arranged with a pitch same as that of the first pad electrodes of the surface-emitting laser devices and electrically connected to each other and a plurality of second contact electrodes arranged with a pitch same as that of the second pad electrodes of the surface-emitting laser devices and electrically connected to each other; and
a power supply unit that applies a current to the first pad electrodes and the second pad electrodes in a condition that the first contact electrodes have contact with the first pad electrodes of the surface-emitting laser devices and the second contact electrodes have contact with the second pad electrodes of the surface-emitting laser devices.

13. The device according to claim 12, further comprising a stage having a temperature control function of heating the wafer to a predetermined temperature.

14. The device according to claim 12, further comprising a plurality of light-receiving elements for respectively monitoring laser lights emitted from the surface-emitting laser devices.

* * * * *